(12) United States Patent
Okimoto et al.

(10) Patent No.: US 11,653,444 B2
(45) Date of Patent: May 16, 2023

(54) WIRING BOARD AND METHOD FOR MANUFACTURING WIRING BOARD

(71) Applicant: DAI NIPPON PRINTING CO., LTD., Tokyo-to (JP)

(72) Inventors: Naoko Okimoto, Tokyo-to (JP); Mitsutaka Nagae, Tokyo-to (JP); Kenichi Ogawa, Tokyo-to (JP); Makiko Sakata, Tokyo-to (JP); Toru Miyoshi, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 53 days.

(21) Appl. No.: 17/439,326

(22) PCT Filed: Mar. 19, 2020

(86) PCT No.: PCT/JP2020/012529
§ 371 (c)(1),
(2) Date: Sep. 14, 2021

(87) PCT Pub. No.: WO2020/189790
PCT Pub. Date: Sep. 24, 2020

(65) Prior Publication Data
US 2022/0183150 A1 Jun. 9, 2022

(30) Foreign Application Priority Data
Mar. 20, 2019 (JP) .............................. JP2019-053328

(51) Int. Cl.
*H05K 1/02* (2006.01)
*H05K 3/46* (2006.01)

(52) U.S. Cl.
CPC ......... *H05K 1/0283* (2013.01); *H05K 3/4688* (2013.01); *H05K 2201/0133* (2013.01); *H05K 2201/0162* (2013.01)

(58) Field of Classification Search
CPC ... H05K 1/0277; H05K 1/0283; H05K 3/4688
See application file for complete search history.

(56) References Cited

FOREIGN PATENT DOCUMENTS

| JP | 2007-281406 A | 10/2007 |
| JP | 2011-108717 A | 6/2011 |
| JP | 2013-187308 A | 9/2013 |
| JP | 2016-219543 A | 12/2016 |
| JP | 2017-513237 A | 5/2017 |
| JP | 2017-168437 A | 9/2017 |

OTHER PUBLICATIONS

Jun. 16, 2020 International Search Report issued in International Patent Application No. PCT/JP2020/012529.
Sep. 16, 2021 International Preliminary Report on Patentability issued in International Patent Application No. PCT/JP2020/012529.

*Primary Examiner* — Jeremy C Norris
(74) *Attorney, Agent, or Firm* — Oliff PLC

(57) ABSTRACT

A wiring board includes a substrate including a first surface and a second surface located on an opposite side to the first surface, where the substrate has stretchability, an interconnection wire located adjacent to the first surface of the substrate, and a stress relaxation layer located between the first surface of the substrate and the interconnection wire, where the stress relaxation layer has a modulus of elasticity lower than that of the substrate.

20 Claims, 10 Drawing Sheets

WIRING BOARD AND METHOD FOR MANUFACTURING WIRING BOARD

TECHNICAL FIELD

Embodiments of the present disclosure relate to a wiring board including a substrate having stretchability and an interconnection wire and a method for manufacturing the wiring board.

BACKGROUND ART

In recent years, research has been conducted on electronic devices having deformability, such as stretchability. For example, there have been known electronic devices having stretchable silver wiring formed on a stretchable substrate and electronic devices having horseshoe-shaped wiring formed on a stretchable substrate (refer to, for example, PTL 1). In addition, PTL 2 describes a stretchable wiring board including a substrate and an interconnection wire provided on the substrate. In PTL 2, a manufacturing method is employed in which circuitry is provided on a substrate that is pre-stretched and, after the circuitry is formed, the substrate is relaxed.

CITATION LIST

Patent Literature

PTL 1: Japanese Unexamined Patent Application Publication No. 2013-187308
PTL 2: Japanese Unexamined Patent Application Publication No. 2007-281406

SUMMARY OF INVENTION

When a substrate having stretchability is deformed and, thus, stress is generated inside the substrate, the substrate may be deformed over time even when an external force applied to the substrate is constant. In this case, the interconnection wire may also be deformed due to the deformation of the substrate over time and, thus, the resistance value and other properties of the interconnection wire may change.

Embodiments of the present disclosure provide a wiring board and a method for manufacturing a wiring board capable of effectively solving such a problem.

According to an embodiment of the present disclosure, a wiring board is provided. The wiring board includes a substrate including a first surface and a second surface located on an opposite side to the first surface, where the substrate has stretchability, an interconnection wire located adjacent to the first surface of the substrate, and a stress relaxation layer located between the first surface of the substrate and the interconnection wire, where the stress relaxation layer has a modulus of elasticity lower than that of the substrate.

The wiring board according to the embodiment of the present disclosure may further include a reinforcing member having a modulus of elasticity higher than that of the substrate.

In the wiring board according to the embodiment of the present disclosure, as viewed in the direction normal to the first surface of the substrate, the interconnection wire may have an end portion that overlaps the reinforcing member.

The wiring board according to the embodiment of the present disclosure may further include an electronic component that overlaps the reinforcing member as viewed in the direction normal to the first surface of the substrate and that is electrically connected to the interconnection wire.

In the wiring board according to the embodiment of the present disclosure, the substrate and the stress relaxation layer may contain the same type of elastomer as a principal component.

In the wiring board according to the embodiment of the present disclosure, the substrate may contain silicone rubber as a primary component.

The wiring board according to the embodiment of the present disclosure may further include a support substrate.

In the wiring board according to the embodiment of the present disclosure, the support substrate may have a modulus of elasticity higher than that of the substrate, and the support substrate may support the interconnection wire.

In the wiring board according to the embodiment of the present disclosure, the support substrate may contain polyethylene naphthalate, polyimide, polycarbonate, acrylic resin, or polyethylene terephthalate.

In the wiring board according to the embodiment of the present disclosure, the interconnection wire may have an undulating portion including a plurality of crest portions and valley portions aligned in a direction in which the interconnection wire extends.

In the wiring board according to the embodiment of the present disclosure, the stress relaxation layer may have a thickness greater than or equal to 0.5 times the amplitude of the crest portions and the valley portions of the undulating portion of the interconnection wire.

In the wiring board according to the embodiment of the present disclosure, the stress relaxation layer may have a thickness greater than or equal to 0.5 times the radius of curvature of the crest portion of the undulating portion of the interconnection wire.

In the wiring board according to the embodiment of the present disclosure, the amplitude of crest portions and valley portions that appear in a portion of the first surface of the substrate that overlaps the undulating portion of the interconnection wire may be less than the amplitude of the crest portions and the valley portions of the undulating portion of the interconnection wire.

In the wiring board according to the embodiment of the present disclosure, the amplitude of crest portions and valley portions that appear in a portion of the first surface of the substrate that overlaps the undulating portion of the interconnection wire may be less than or equal to 0.5 times the amplitude of the crest portions and the valley portions of the undulating portion of the interconnection wire.

In the wiring board according to the embodiment of the present disclosure, the pitch of the crest portion and the valley portion that appear in a portion of the first surface of the substrate that overlaps the undulating portion of the interconnection wire may be less than the pitch of the crest portion and the valley portion of the undulating portion of the interconnection wire.

According to an embodiment of the present disclosure, a method for manufacturing a wiring board is provided. The method includes the step of preparing a laminate including a substrate having a first surface and a second surface located on an opposite side to the first surface and a stress relaxation layer located adjacent to the first surface of the substrate, where the substrate has stretchability and the stress relaxation layer has a modulus of elasticity lower than that of the substrate, the stretch step of applying tension to the laminate in at least a first direction that is one of the in-plane directions of the first surface of the substrate and stretching the laminate, the interconnection wire forming step of providing an interconnection wire on the stress relaxation layer of the laminate being stretched in the stretch step, and the contraction step of removing the tension from the laminate.

According to the embodiments of the present disclosure, deformation of an interconnection wire over time can be reduced.

DESCRIPTION OF EMBODIMENTS

Figure 1:
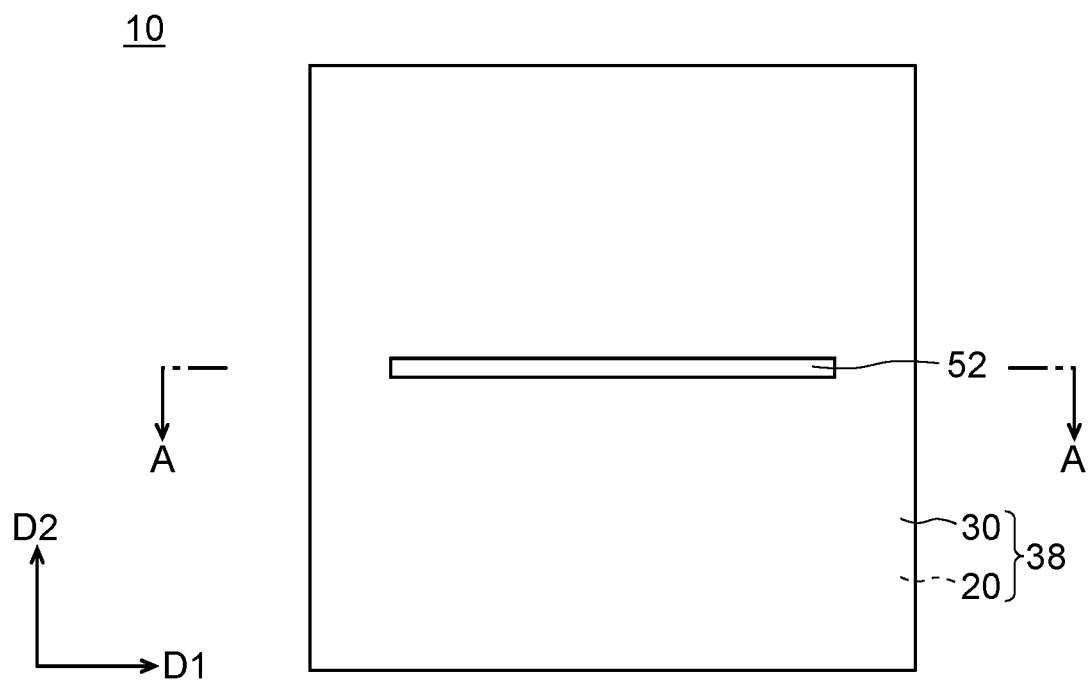
FIG. 1 is a plan view of a wiring board according to an embodiment.

The structure of a wiring board according to an embodiment of the present disclosure and a method for manufacturing the wiring board are described in detail below with reference to the accompanying drawings. Note that the embodiments described below are merely examples of an embodiment of the present disclosure, and the present disclosure is not to be construed as limited to these embodiments. In addition, terms such as "board", "substrate", "sheet", and "film" as used herein are not distinguished from each other based solely on differences in naming among them. For example, "board" is a concept that includes members that can be referred to as a substrate, a sheet, or a film. Furthermore, the terms as used herein to identify the shape, the geometric conditions, or their degrees, such as "parallel" and "orthogonal," and the numerical values of, for example, lengths and angles are not used in a strict sense, and shall be interpreted to include the extent to which similar functions can be expected, without being bound to the strict meaning. In the drawings referred to in the present embodiment, the same or similar reference signs are attached to the same parts or parts having similar functions, and descriptions of the parts may not be repeated. In addition, the dimensional proportions in the drawings may differ from the actual proportions for convenience of description, and some of the configurations may be removed from the drawings.

An embodiment of the present disclosure is described below with reference to FIGS. 1 to 7.

(Wiring Board)

Figure 2:
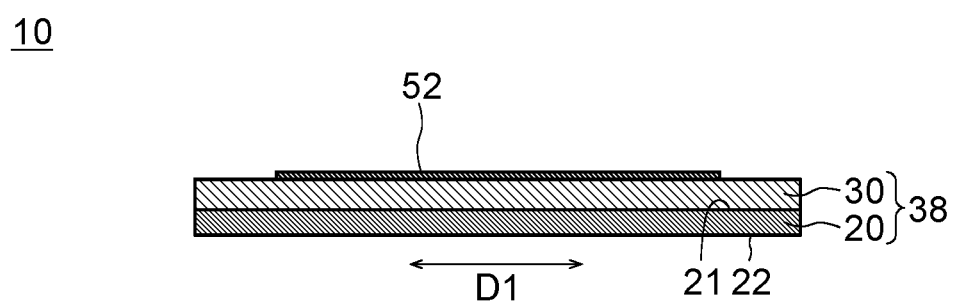
FIG. 2 is a sectional view of the wiring board taken along line A-A of FIG. 1.

A wiring board 10 according to the present embodiment is described first. FIG. 1 is a plan view of the wiring board 10. FIG. 2 is a sectional view of the wiring board 10 taken along line A-A of FIG. 1.

The wiring board 10 illustrated in FIG. 1 includes at least a substrate 20, an interconnection wire 52, and a stress relaxation layer 30. Each of the constituent elements of the wiring board 10 is described below.

[Substrate]

The substrate 20 is a member configured to have stretchability in at least one direction. The substrate 20 has a first surface 21 located adjacent to an interconnection wire 52 and a second surface 22 located on an opposite side to the first surface 21. In an example illustrated in FIG. 1, as viewed in the direction normal to the first surface 21, the substrate 20 has a quadrangular shape having a pair of sides extending in a first direction D1 and a pair of sides extending in a second direction D2. The first direction D1 and the second direction D2 may be orthogonal to each other as illustrated in FIG. 1 or may not be orthogonal to each other, although not illustrated. In the following description, view of the wiring board 10 or a constituent element of the wiring board 10 in the direction normal to the first surface 21 is also simply referred to as "plan view". According to the present embodiment, the substrate 20 may have stretchability in at least the first direction D1. The substrate 20 may have stretchability in any direction in addition to the first direction D1.

The thickness of the substrate 20 is, for example, greater than or equal to 10 μm and less than or equal to 10 mm, and more preferably greater than or equal to 20 μm and less than or equal to 3 mm. By setting the thickness of the substrate 20 to greater than or equal to 10 μm, the durability of the substrate 20 can be ensured. In addition, by setting the thickness of the substrate 20 to less than or equal to 10 mm, the comfort of wearing the wiring board 10 can be ensured. Note that if the thickness of the substrate 20 is made too small, the stretchability of the substrate 20 may be impaired.

Note that the stretchability of the substrate 20 refers to the characteristic that the substrate 20 can stretch and contract, that is, the characteristic that the substrate 20 can stretch from its normal, non-stretched condition and can return to its normal condition when the substrate 20 is released from the stretched condition. In the following description, the characteristic that the substrate 20 can recover when released from the stretched condition is also referred to as resilience. The non-stretched condition is the condition of the substrate 20 with no tensile stress being applied. According to the present embodiment, the stretchable substrate can preferably be stretched from the non-stretched condition by greater than or equal to 1% without being destroyed, more preferably by greater than or equal to 20%, and even more preferably by greater than or equal to 75%. By using a substrate 20 having such capability, the wiring board 10 can have stretchability throughout the entire region. Furthermore, the wiring board 10 can be used in products and applications that require high stretchability (products and applications that are attached to a body part, such as a person's arm). It is generally reported that a product to be attached to a person's armpit needs to have stretchability of 72% in the vertical direction and 27% in the horizontal direction. In addition, a product to be attached to the knees, elbows, buttocks, ankles, and armpits of a person needs to have stretchability of greater than or equal to 26% and less than or equal to 42% in the vertical direction. A product to be attached to another part of a person needs stretchability of less than 20%.

In addition, it is desirable that the difference be small between the shape of the substrate 20 in its non-stretched condition and the shape of the substrate 20 when it is stretched from its non-stretched condition and then returns to the non-stretched condition again. Hereinafter, this difference is also referred to as a change in shape. The change in shape of the substrate 20 is, for example, less than or equal to 20% in area ratio, more preferably less than or equal to 10%, and even more preferably less than or equal to 5%. The use of a substrate 20 with a small change in shape facilitates formation of crest portions and valley portions (described below).

An example of a parameter representing the stretchability of the substrate 20 is the modulus of elasticity of the substrate 20. The modulus of elasticity of the substrate 20 is, for example, lower than or equal to 10 MPa, and more preferably lower than or equal to 1 MPa. By using the substrate 20 having such a modulus of elasticity, the entire wiring board 10 can be given elasticity. In the following description, the modulus of elasticity of the substrate 20 is also referred to as a first modulus of elasticity. The first modulus of elasticity of the substrate 20 may be higher than or equal to 1 kPa.

To calculate the first modulus of elasticity of the substrate 20, a tensile test can be performed on a sample of the substrate 20 in accordance with JIS K6251. Alternatively, the first modulus of elasticity of a sample of the substrate 20 can be measured by the nanoindentation method in accordance with ISO 14577. As a measuring instrument for the nanoindentation method, a nanoindenter can be used. To prepare a sample of the substrate 20, part of the substrate 20 may be taken out from the wiring board 10 as a sample, or part of the substrate 20 may be taken out as a sample before the wiring board 10 is configured. Still alternatively, to calculate the first modulus of elasticity of the substrate 20, the material that constitutes the substrate 20 may be analyzed and, thereafter, the first modulus of elasticity of the substrate 20 may be calculated on the basis of a database of the material. Note that the modulus of elasticity in the present application is the modulus of elasticity measured under an environment of 25° C.

Another example of a parameter representing the stretchability of the substrate 20 is the bending stiffness of the substrate 20. The bending stiffness is the product of the second moment of area of a target member and the modulus of elasticity of the material constituting the target member, and is measured in the unit of $N \cdot m^2$ or $Pa \cdot m^4$. The second moment of area of the substrate 20 is calculated on the basis of the sectional surface of the substrate 20 obtained when a portion of the substrate 20 that overlaps the interconnection wire 52 is cut by a plane orthogonal to the stretching and contracting direction of the wiring board 10.

The substrate 20 may contain elastomer as a primary component. Alternatively, the substrate 20 may contain fabric, such as woven fabric, knit fabric, or non-woven fabric as a primary component. Note that the term "primary component" is a component that accounts for greater than or equal to 51% by weight in the target component elements. As elastomers, widely used thermoplastic elastomers and thermosetting elastomers can be used. More specifically, any one of the following elastomers can be used: polyurethane elastomer, styrene elastomer, nitrile elastomer, olefin elastomer, vinyl chloride elastomer, ester elastomer, amide elastomer, 1,2-BR-based elastomer, fluoroelastomer, silicone rubber, urethane rubber, fluoro rubber, polybutadiene, polyisobutylene, polystyrene butadiene, polychloroprene, and the like. In view of the mechanical strength and abrasion resistance, it is desirable that urethane-based elastomer be used. In addition, the substrate 20 may contain a silicone, such as polydimethylsiloxane. Silicone has excellent heat resistance, chemical resistance, and flame retardance and, thus, is desirable for the material for the substrate 20.

[Interconnection Wire]

The interconnection wire 52 is a member that is electrically conductive and has an elongated shape in plan view. In the example illustrated in FIG. 1, the interconnection wire 52 extends in the first direction D1, which is one of the in-plane directions of the first surface 21 of the substrate 20.

According to the present embodiment, the interconnection wire 52 is located adjacent to the first surface 21 of the substrate 20. As illustrated in FIG. 2, the stress relaxation layer 30 is located between the first surface 21 of the substrate 20 and the interconnection wire 52.

As the material for the interconnection wire 52, a material is used that can follow stretch and contraction of the substrate 20 by using the disappearance and formation of an undulating portion (described below). The material that can be used for the interconnection wire 52 may or may not have stretchability per se. Examples of a metal that can be used for the interconnection wire 52 and that does not have stretchability per se include metals, such as gold, silver, copper, aluminum, platinum, and chromium, and alloys containing such metals. If the material for the interconnection wire 52 does not have elasticity per se, a metal film can be used as the interconnection wire 52. If the material used for the interconnection wire 52 has stretchability per se, the stretchability of the material is the same as that of the substrate 20, for example. An example of a material that can be used for the interconnection wire 52 and that has stretchability per se is a conductive composition that contains conductive particles and an elastomer. Any conductive particles that can be used for an interconnection wire can be selected. Examples of conductive particles include, for example, particles of gold, silver, copper, nickel, palladium, platinum, carbon, and the like. Among them, silver particles are desirably used.

It is desirable that the interconnection wire 52 have a structure that is resistant to deformation. For example, the interconnection wire 52 has a base material and a plurality of electrically conductive particles dispersed in the base material. In this case, by using a deformable material, such as resin, as the base material, the interconnection wire 52 can also be deformed in accordance with the stretch and contraction of the substrate 20. In addition, by setting the distribution and shape of the conductive particles such that contact among the plurality of conductive particles is maintained even when deformation occurs, the electrical conductivity of the interconnection wire 52 can be maintained.

A widely used thermoplastic elastomer or thermosetting elastomer can be used as the material for the base material of the interconnection wire 52. Examples of the base material to be used include styrene elastomer, acrylic elastomer, olefin elastomer, urethane elastomer, silicone rubber, urethane rubber, fluorine rubber, nitrile rubber, polybutadiene, and polychloroprene. Among them, resins and rubbers containing a urethane or silicone structure are desirably used due to their stretchability and durability. In addition, as the material of the conductive particles of interconnection wire 52, particles of silver, copper, gold, nickel, palladium, platinum, carbon, or the like can be used, for example. Among them, silver particles are desirably used.

The thickness of the interconnection wire 52 can be any thickness that is sufficient to withstand the stretch and contraction of the substrate 20, and is selected appropriately in accordance with the material of the interconnection wire 52. For example, if the material of the interconnection wire 52 does not have stretchability, the thickness of the interconnection wire 52 can be greater than or equal to 25 nm and less than or equal to 100 µm, preferably greater than or equal to 50 nm and less than or equal to 50 µm, and more preferably greater than or equal to 100 nm and less than or equal to 5 µm. However, if the material of the interconnection wire 52 has stretchability, the thickness of the interconnection wire 52 can be greater than or equal to 5 µm and less than or equal to 60 µm, and preferably greater than or equal to 10 µm and less than or equal to 50 µm, and more preferably greater than or equal to 20 µm and less than or equal to 40 µm.

The width of the interconnection wire 52 is selected appropriately in accordance with the electrical resistance required for the interconnection wire 52. For example, the width of the interconnection wire 52 is greater than or equal to 1 µm, and preferably greater than or equal 50 µm. In addition, for example, the width of the interconnection wire 52 is less than or equal to 10 mm, and preferably less than or equal to 1 mm.

The method for forming the interconnection wire 52 is selected as appropriate in accordance with the material and the like. For example, a metal film is formed on a stretchable laminate 38 including the substrate 20 or a support substrate 40 (described below) by vapor deposition, sputtering, stacking of a metal foil, or the like. Thereafter, the metal film is patterned by a photolithography method. When stacking a metal foil on the stretchable laminate 38 or the support substrate 40 (described below), an adhesive layer or the like may be interposed between the metal foil and the stretchable laminate 38 or the support substrate 40. In the case where the material of the interconnection wire 52 has stretchability per se, for example, the above-described conductive composition containing the conductive particles and elastomer can be printed in a pattern on the stretchable laminate 38 or the support substrate 40 by a widely used printing method. Among these methods, the printing method, which is material-efficient and inexpensive for production, may be desirably used.

[Stress Relaxation Layer]

The stress relaxation layer 30 is a layer provided between the first surface 21 of the substrate 20 and the interconnection wire 52 in order to mitigate the influence, on the interconnection wire 52, of deformation that occurs in the substrate 20. In the example illustrated in FIG. 1, the stress relaxation layer 30 is provided over the entire region of the first surface 21 of the substrate 20. Note that although not illustrated, the stress relaxation layer 30 does not necessarily have to be provided in a region that does not overlap the interconnection wire 52 in plan view.

The stress relaxation layer 30 has a modulus of elasticity that is lower than the first modulus of elasticity of the substrate 20. The modulus of elasticity of the stress relaxation layer 30 is, for example, lower than or equal to 2 MPa and may be lower than or equal to 0.1 MPa, lower than or equal to 0.07 MPa, lower than or equal to 0.05 MPa, or lower than or equal to 0.03 MPa. The small modulus of elasticity of the stress relaxation layer 30 allows the stress relaxation layer 30 to be less resilient to deformation. For example, the stress relaxation layer 30 itself is not necessarily resilient enough to return to its original shape when it is released from a stretch process (described below). Even in this case, since the substrate 20 is resilient, the whole laminate including the substrate 20 and the stress relaxation layer 30 can return to its original dimensions. The low resilience of the stress relaxation layer 30 can reduce deformation of the interconnection wire 52 due to the deformation of the substrate 20 over time. In the following description, the modulus of elasticity of the stress relaxation layer 30 is also referred to as a second modulus of elasticity.

The stress relaxation layer 30 may include an elastomer as a primary component. For example, the stress relaxation layer 30 may contain, as a primary component, an elastomer that is the same as the elastomer included in the substrate 20 as a primary component. As the elastomer in the stress relaxation layer 30, the elastomer described as an example of the elastomer of the substrate 20 can be used.

The modulus of elasticity of the stress relaxation layer 30 may be determined relative to the modulus of elasticity of the substrate 20. For example, the modulus of elasticity of the stress relaxation layer 30 may be lower than or equal to 0.7 times the modulus of elasticity of the substrate 20, lower than or equal to 0.5 times, lower than or equal to 0.3 times, or lower than or equal to 0.1 times. In addition, the modulus of elasticity of the stress relaxation layer 30 may be higher than or equal to 0.01 times the modulus of elasticity of the substrate 20, higher than or equal to 0.03 times, higher than or equal to 0.05 times, higher than or equal to 0.1 times, higher than or equal to 0.3 times, or higher than or equal to 0.5 times. The range of the ratio of the modulus of elasticity of the stress relaxation layer 30 to the modulus of elasticity of the substrate 20 may be determined by a combination of any one of the upper limits and any one of the lower limits described above. For example, the modulus of elasticity of stress relaxation layer 30 may be higher than or equal to 0.01 times the modulus of elasticity of substrate 20 and lower than or equal to 0.7 times the modulus of elasticity of substrate 20, higher than or equal to 0.01 times and lower than or equal to 0.5 times, higher than or equal to 0.01 times and lower than or equal to 0.3 times, higher than or equal to 0.03 times and lower than or equal to 0.7 times, higher than or equal to 0.05 times and lower than or equal to 0.7 times, higher than or equal to 0.1 times and lower than or equal to 0.7 times, higher than or equal to 0.3 times and lower than or equal to 0.7 times, or higher than or equal to 0.5 times and lower than or equal to 0.7 times.

A method for calculating the second modulus of elasticity of the stress relaxation layer 30 can be determined appropriately in accordance with the configuration of the stress relaxation layer 30. For example, like the method for calculating the modulus of elasticity of the substrate 20 described above, to calculate the second modulus of elasticity of the stress relaxation layer 30, a tensile test can be performed on a sample of the stress relaxation layer 30 in accordance with JIS K6251. Alternatively, the modulus of elasticity of the sample of the stress relaxation layer 30 can be measured by the nanoindentation method in accordance with ISO 14577.

Another example of a parameter that represents the mechanical properties of the stress relaxation layer 30 is the hardness of the stress relaxation layer 30. A method for measuring the hardness can be determined appropriately in accordance with the configuration and the hardness of the object. For example, a type A durometer hardness test or a type D durometer hardness test in accordance with JIS K6253-1997 or ASTM D2240-2005 can be employed. More specifically, a pushpin is brought into contact with a sample to be measured, such as the stress relaxation layer 30, under a load of 10N, and the scale is read after 3 seconds. In the following description, the hardness measured through the durometer hardness test is referred to as, for example, "Durometer A5", where "A" denotes the durometer type and "5" denotes the hardness.

The hardness of the stress relaxation layer 30 is less than the hardness of the substrate 20. The hardness of the stress relaxation layer 30 is, for example, less than or equal to Durometer A50 and may be less than or equal to Durometer A30, less than or equal to Durometer A10, or less than or equal to Durometer A5. The smaller hardness of the stress relaxation layer 30 allows the stress relaxation layer 30 to be less resilient to deformation.

The thickness of the stress relaxation layer 30 can be any thickness that is sufficient to withstand the stretch and contraction of the substrate 20, and is selected appropriately in accordance with the material or the like of the stress relaxation layer 30. For example, the thickness of the stress relaxation layer 30 can be greater than or equal to 0.1 μm and may be greater than or equal to 1 μm, or greater than or equal to 10 μm. The thickness of the stress relaxation layer 30 may be greater than the thickness of an adhesive layer 60 (described below). In addition, for example, the thickness of the stress relaxation layer 30 can be less than or equal to 5 mm, and may be less than or equal to 1 mm, less than or equal to 500 μm, or less than or equal to 100 μm. If the thickness of the stress relaxation layer 30 is too small, sufficient effect to mitigate the stress caused by deformation of the substrate 20 is not able to be obtained in some cases. However, if the thickness of the stress relaxation layer 30 is too large, it may be difficult for an undulating portion 55 (described below) to be formed in the interconnection wire 52.

The thickness of the stress relaxation layer 30 may be determined relative to the thickness of the substrate 20. For example, the thickness of the stress relaxation layer 30 may be greater than or equal to 0.5 times the thickness of the substrate 20, greater than or equal to 0.8 times, greater than or equal to 1.0 times, greater than or equal to 1.2 times, greater than or equal to 1.5 times, or greater than or equal to 2.0 times. In addition, the thickness of the stress relaxation layer 30 may be less than or equal to 3.0 times the thickness of the substrate 20, less than or equal to 2.5 times, or less than or equal to 2.0 times.

The stress relaxation layer 30 usually does not have adhesive properties. The wiring board 10 may have an adhesive layer located between the substrate 20 and the support substrate 40 (described below). The stress relaxation layer 30 is a layer that is distinguished from the adhesive layer. The adhesive strength of the stress relaxation layer 30 is, for example, less than or equal to 0.01 N/25 mm, and may be less than or equal to 0.005 N/25 mm or less than or equal to 0.001 N/25 mm.

To measure the adhesive strength of the stress relaxation layer 30, a method for performing a 180° peel test using a sample of the stress relaxation layer 30 can be adopted. To prepare a sample of the stress relaxation layer 30, part of the stress relaxation layer 30 may be taken out from the wiring board 10 as a sample, or part of the stress relaxation layer 30 may be taken out as a sample before the wiring board 10 is configured. Alternatively, the material of the stress relaxation layer 30 may be analyzed, and the adhesive strength of the stress relaxation layer 30 may be obtained on the basis of an existing material database. In the 180° peel test, a 25 mm wide specimen is taken out first, and a 25 mm wide glass plate is bonded to a surface of the specimen adjacent to the stress relaxation layer 30. Subsequently, the adhesive strength (N/25 mm) to the glass plate is measured using a tensile test machine under the following conditions: the tensile speed is 1200 mm/min, the peel angle is 180°, the temperature is 20° C., and the humidity is 50%.

The stress relaxation layer 30 may have stretchability. Like the above-described stretchability of the substrate 20, the stretchability of the stress relaxation layer 30 means the characteristic that the stress relaxation layer 30 can stretch and contract, that is, the characteristic that the stress relaxation layer 30 can stretch from its normal, non-stretched condition and can return to its normal condition when the stress relaxation layer 30 is released from the stretched condition. According to the present embodiment, the stretchable stress relaxation layer 30 can stretch preferably by greater than or equal to 1% from its non-stretched condition without being destroyed, and more preferably by greater than or equal to 20%. By using the stress relaxation layer 30 having such capability, the stretchability of the wiring board 10 can be increased.

In addition, like the substrate 20 described above, it is desirable that the change in shape of the stress relaxation layer 30 be small. The change in shape of the stress relaxation layer 30 is, for example, less than or equal to 20% in area ratio. By using a stress relaxation layer 30 with a small change in shape facilitates formation of crest portions and valley portions (described below).

A method for forming the stress relaxation layer 30 is selected appropriately in accordance with the material and the like. For example, after preparing the substrate 20, the material for the stress relaxation layer 30 is provided on the substrate 20 by a coating method or the like. Thus, a laminate is obtained in which the stress relaxation layer 30 is stacked on the first surface 21 of the substrate 20. Alternatively, a laminate in which the stress relaxation layer 30 is stacked on the first surface 21 of the substrate 20 can be obtained by pouring the material for the substrate 20 and the material for the stress relaxation layer 30 into a predetermined mold and solidifying the materials.

In the following description, the laminate that includes at least the substrate 20 and the stress relaxation layer 30 and that is to be stretched in a stretch process (described below) is also referred to as a stretchable laminate.

Figure 3:
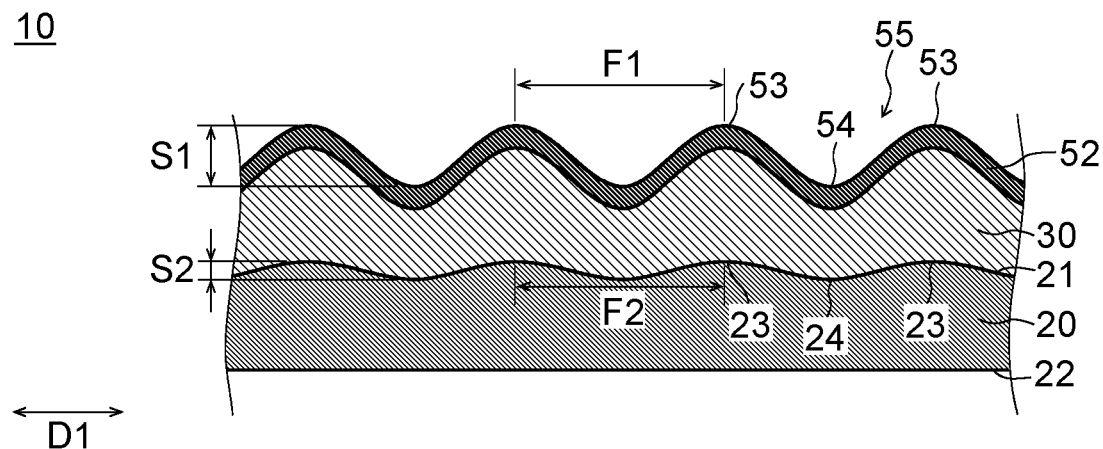
FIG. 3 is an enlarged sectional view of the wiring board illustrated in FIG. 2.

The sectional shape of the wiring board 10 is described in detail below. FIG. 3 is an enlarged view of the wiring board 10 illustrated in FIG. 2.

As described below, the interconnection wire 52 is provided on the stretchable laminate 38 including the substrate 20 and the stress relaxation layer 30 with a tension being applied to stretch the laminate by a first stretch amount. In this case, when the tension applied to the stretchable laminate 38 is removed and, thus, the stretchable laminate 38 contracts, the interconnection wire 52 deforms into an undulating shape and, thus, has an undulating portion 55, as illustrated in FIG. 3.

The undulating portion 55 of the interconnection wire 52 includes a plurality of crest portions 53 aligned in the first direction D1 in which the interconnection wire 52 extends. The crest portions 53 are portions that rise from a surface of the interconnection wire 52 in the direction normal to the first surface 21. As illustrated in FIG. 3, there may be a valley portion 54 between two crest portions 53 adjacent to each other in the direction in which the interconnection wire 52 extends.

The crest portions 53 and valley portions 54 of the interconnection wire 52 are aligned in the direction in which the interconnection wire 52 extends. However, the arrangement is not limited thereto. Although not illustrated, the direction in which the crest portions 53 and valley portions 54 of the interconnection wire 52 are aligned does not necessarily be the same as the direction in which the interconnection wire 52 extends. Although FIG. 3 illustrates an example in which a plurality of crest portions 53 and valley portions 54 of the undulating portion 55 are aligned at equal pitches, the arrangement is not limited thereto. Although not illustrated, the plurality of crest portions 53 and valley portions 54 of the undulating portion 55 may be aligned at unequal pitches. For example, the distance between two adjacent crest portions 53 is not necessarily the same everywhere.

In FIG. 3, the reference sign S1 represents the amplitude of the crest portions and valley portions appearing in a portion of a surface of the wiring board 10 adjacent to the first surface 21 that overlaps the undulating portion 55 of the interconnection wire 52 in plan view. In an example illustrated in FIG. 3, since the interconnection wire 52 is located on the surface of the wiring board 10, the amplitude S1 is the amplitude of the crest portion 53 and valley portion 54 of the interconnection wire 52.

The amplitude S1 is, for example, greater than or equal to 1 µm, and more preferably greater than or equal to 10 µm. By setting the amplitude S1 to greater than or equal to 10 µm, the interconnection wire 52 follows the stretch of the stretchable laminate 38 so as to be easily deformed. Note that the amplitude S1 may be less than or equal to 500 µm, for example.

The above-mentioned stress relaxation layer 30 is a layer for reducing changes in the shapes of the crest portions 53 and valley portions 54 of the interconnection wire 52 over time. For this reason, it is desirable that the stress relaxation layer 30 have a thickness corresponding to the amplitude S1 of the crest portion 53 and valley portion 54 of the interconnection wire 52. For example, the thickness of the stress relaxation layer 30 is preferably greater than or equal to 0.5 times the amplitude S1 of the crest portion 53 and valley portion 54 of the interconnection wire 52, and may be greater than or equal to 0.7 time, greater than or equal to 1.0 times, or greater than or equal to 1.5 times. In addition, the thickness of the stress relaxation layer 30 is preferably greater than or equal to 0.5 times the radius of curvature of the crest portion 53 of the interconnection wire 52, and may be greater than or equal to 0.7 times, greater than or equal to 1.0 times, or greater than or equal to 1.5 times.

The amplitude of the crest portion and valley portion is calculated, for example, by measuring the distance between a crest portion and a valley portion adjacent to each other in the direction normal to the stretchable laminate 38 over a certain range in the direction in which the crest portions and valley portions are aligned and, thereafter, calculating the average of the distances. The "certain range in the direction in which the crest portions and valley portions are aligned" is, for example, 10 mm. To measure the distance between adjacent crest portion and valley portion, a non-contact measuring instrument, such as a laser microscope, may be used, or a contact measuring instrument may be used. Alternatively, the distance between adjacent crest portion and valley portion may also be measured on the basis of an image, such as a sectional photograph.

In FIG. 3, the reference sign F1 represents the pitch of the crest portion and valley portion that appear in the portion of the surface of the wiring board 10 adjacent to the first surface 21 that overlaps the undulating portion 55 of the interconnection wire 52 in plan view. In the example illustrated in FIG. 3, since the interconnection wire 52 is located on the surface of the wiring board 10, the pitch F1 is the pitch of the crest portion 53 and valley portion 54 of the interconnection wire 52. The pitch F1 is, for example, greater than or equal to 10 µm, and more preferably greater than or equal to 100 µm. In addition, the pitch F1 is, for example, less than or equal to 100 mm, and more preferably less than or equal to 10 mm. The pitch F1 of the crest portion and valley portion is calculated by measuring the intervals of the plurality of crest portions over a certain range in the direction in which the crest portions and valley portions are aligned and, thereafter, calculating the average of the intervals.

As illustrated in FIG. 3, a plurality of crest portions 23 and valley portions 24 aligned in the direction in which the interconnection wire 52 extends may also appear in a portion of the first surface 21 of the substrate 20 that overlaps the undulating portion 55 of the interconnection wire 52 in plan view. Note that the shapes of the crest portions 23 and valley portions 24 that appear in the first surface 21 of the substrate 20 may change over time.

In FIG. 3, the reference sign S2 represents the amplitude of the plurality of crest portions 23 and valley portions 24 of the first surface 21 of the substrate 20 aligned in the direction in which the interconnection wire 52 extends. The amplitude S2 of the crest portion 23 and valley portion 24 of the first surface 21 of the substrate 20 may be less than the amplitude of the crest portion 53 and valley portion 54 of the undulating portion 55 of the interconnection wire 52. For example, the amplitude S2 may be less than or equal to 0.9 times the amplitude S1, less than or equal to 0.7 times, less than or equal to 0.5 times, or less than or equal to 0.3 times. In addition, the amplitude S2 may be greater than or equal to 0.1 times the amplitude S1, or greater than or equal to 0.2 times. The concept of the phrase "the amplitude S2 of the crest portion 23 and valley portion 24 of the first surface 21 of the substrate 20 is less than the amplitude S1 of the crest portion 53 and valley portion 54 of the interconnection wire 52" can also apply to the case where the crest portions and valley portions do not appear in the first surface 21 of the substrate 20.

In FIG. 3, the reference sign F23 represents the pitch of the plurality of crest portions 23 and valley portions 24 of the first surface 21 of the substrate 20 aligned in the direction in which the interconnection wire 52 extends. A pitch F2 of the crest portion 23 and valley portion 24 of the first surface 21 of the substrate 20 may be the same as the pitch F1 of the crest portion 53 and valley portion 54 of the undulating portion 55 of the interconnection wire 52. Alternatively, the pitch F2 may be less than the pitch F1. For example, the pitch F2 may be less than or equal to 0.9 times the pitch F1, less than or equal to 0.7 times, less than or equal to 0.5 times, or less than or equal to 0.3 times. In addition, the pitch F2 may be greater than or equal to 0.1 times the pitch F1 or greater than or equal to 0.2 times. The concept of the phrase "the pitch F2 of the crest portion 23 and valley portion 24 of the first surface 21 of the substrate 20 is less than the pitch F1 of the crest portion 53 and valley portion 54 of the interconnection wire 52" can also apply to the case where the crest portions and valley portions do not appear in the first surface 21 of the substrate 20.

As described above, the substrate 20 has the resilience. Therefore, as illustrated in FIG. 3, when crest portions 23 and valley portions 24 appear in the first surface 21 of the substrate 20, a restorative force is generated in the substrate 20. The restorative force attempts to cause the crest portions 23 and valley portions 24 to disappear and cause the substrate 20 to return to its original shape. In this case, the shapes of the crest portions 23 and valley portions 24 may change over time due to the restorative force of the substrate 20. For example, the amplitude S2 and width of the crest portion 23 of the first surface 21 of the substrate 20 may decrease over time.

According to the present embodiment, the stress relaxation layer 30 having lower resilience than the substrate 20 is provided between the first surface 21 of the substrate 20 and the interconnection wire 52. Accordingly, even when the shapes of the crest portions 23 and valley portions 24 of the first surface 21 of the substrate 20 change over time, the stress relaxation layer 30 can reduce the influence of such a change on the interconnection wire 52. As a result, deformation of the undulating portion 55 of the interconnection wire 52 that occurs over time can be reduced.

Figure 4:
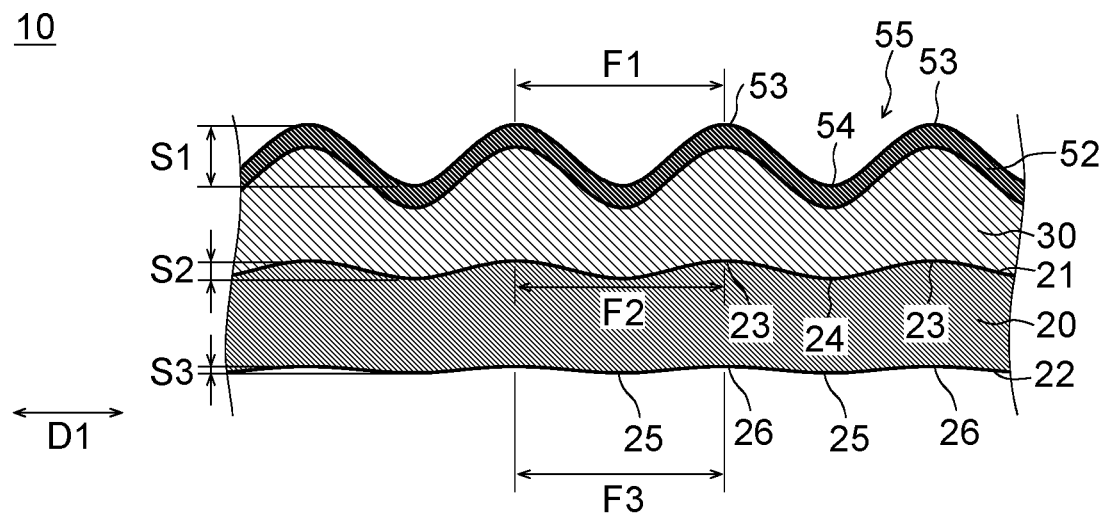
FIG. 4 is another example of a sectional view of the wiring board.

FIG. 4 illustrates another example of the sectional shape of the wiring board 10. As illustrated in FIG. 4, a plurality of crest portions 25 and valley portions 26 aligned in the direction in which the interconnection wire 52 extends may also appear in the surface of the wiring board 10 adjacent to the second surface 22 of the substrate 20. In the example illustrated in FIG. 4, the crest portions 25 adjacent to the second surface 22 appear at positions overlapping the valley portions 54 of the undulating portion 55 of the interconnection wire 52, and the valley portions 26 adjacent to the second surface 22 appear at positions overlapping the crest portions 53 of the undulating portion 55 of the interconnection wire 52 in plan view.

In FIG. 4, the reference sign S3 represents the amplitude of the plurality of crest portions 25 and valley portions 26 of the surface of the wiring board 10 adjacent to the second surface 22 of the substrate 20, which are aligned in the direction in which the interconnection wire 52 extends. The amplitude S3 of the crest portions 25 and valley portions 26 adjacent to the second surface 22 may be the same as or different from the amplitude S2 of the crest portions 23 and valley portions 24 adjacent to the first surface 21. For example, the amplitude S3 of the crest portions 25 and valley portions 26 adjacent to the second surface 22 may be less than or equal to the amplitude S2 of the crest portions 23 and valley portions 24 adjacent to the first surface 21. For example, the amplitude S3 may be less than or equal to 0.9 times the amplitude S2, less than or equal to 0.8 times, or less than or equal to 0.6 times. In addition, the amplitude S3 may be greater than or equal to 0.1 times the amplitude S2 or greater than or equal to 0.2 times. Note that the concept of the phrase "the amplitude S3 of the crest portions 25 and valley portions 26 adjacent to the second surface 22 is less than the amplitude S2 of the crest portions 23 and valley portions 24 adjacent to the first surface 21" can also apply to the case where the crest portions and valley portions do not appear in the surface of the wiring board 10 adjacent to the second surface 22.

In FIG. 4, the reference sign F3 represents the pitch of the plurality of crest portions 25 and valley portions 26 aligned in the surface of the wiring board 10 adjacent to the second surface 22 of the substrate 20 in the direction in which the interconnection wire 52 extends. The pitch F3 of the crest portions 25 and valley portions 26 adjacent to the second surface 22 may be the same as the pitch F2 of the crest portions 23 and valley portions 24 adjacent to the first surface 21. Alternatively, the pitch F3 may be greater than the pitch F2. For example, the pitch F3 may be greater than or equal to 1.1 times the pitch F2, greater than or equal to 1.2 times, greater than or equal to 1.5 times, or greater than or equal to 2.0 times. The concept of the phrase "the pitch F3 of the crest portions 25 and valley portions 26 adjacent to the second surface 22 is less than the pitch F2 of the crest portions 23 and valley portions 24 adjacent to the first surface 21" also applies to the case where the crest portions and valley portions do not appear in the surface of the wiring board 10 adjacent to the second surface 22.

Figure 5:
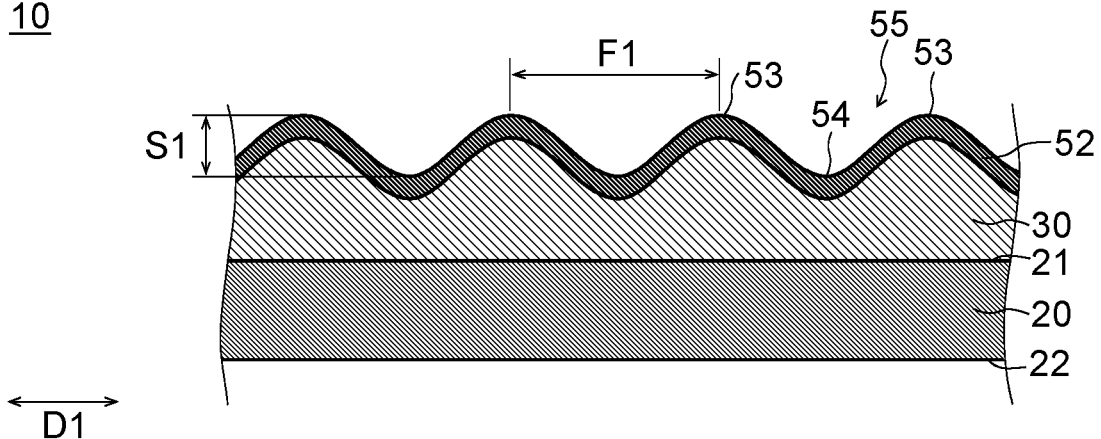
FIG. 5 is another example of a sectional view of the wiring board.

FIG. 5 illustrates another example of a sectional view of the wiring board 10. As illustrated in FIG. 5, the crest portions and valley portions do not necessarily appear in the first surface 21 of the substrate 20. Such a first surface 21 of the substrate 20 can be generated, for example, by disappearance of the crest portions and valley portions of the first surface 21 of the substrate 20, which were produced at the completion of a contraction process (described below), due to deformation of the substrate 20 over time.

Figure 6:
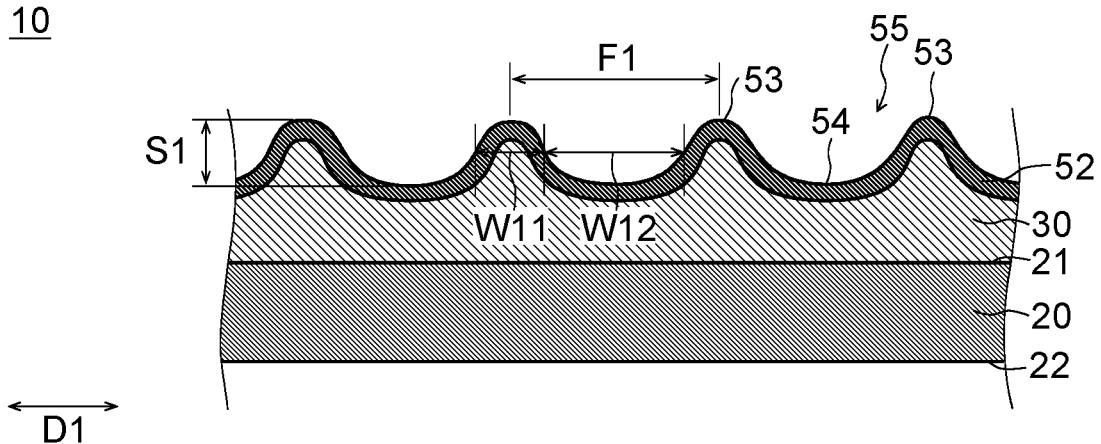
FIG. 6 is another example of a sectional view of the wiring board.

FIG. 6 illustrates another example of a sectional view of the wiring board 10. As illustrated in FIG. 6, in the undulating portion 55 of the interconnection wire 52, a width W11 of the crest portion 53 may be less than the width W12 of the valley portion 54. Such crest portions 53 can be generated, for example, by deformation of the crest portions and valley portions of the first surface 21 of the substrate 20 over time and its influence transmitted to the undulating portion 55 of the interconnection wire 52. According to the present embodiment, by providing the stress relaxation layer 30 between the first surface 21 of the substrate 20 and the interconnection wire 52, the ratio of the width W11 of the crest portion 53 to a width W12 of the valley portion 54 can be inhibited from becoming too small. Thus, for example, the radius of curvature of the crest portion 53 can be inhibited from becoming too small. Note that the width W11 of the crest portion 53 and the width W12 of the valley portion 54 are the width of the crest portion 53 and the width of the valley portion 54 at the middle point of the amplitude S1, respectively. The width W11 of the crest portion 53 is preferably greater than or equal to 0.3 times the width W12 of the valley portion 54, and may be greater than or equal to 0.5 times the width W12 or greater than or equal to 0.7 times. In addition, the width W11 of the crest portion 53 may be less than or equal to 0.9 times the width W12 of the valley portion 54, less than or equal to 0.8 times, or less than or equal to 0.7 times.

Although not illustrated, the positions of the crest portions 23 and valley portions 24 of the first surface 21 of the substrate 20 may be displaced from the positions of the crest portions 53 and valley portions 54 of the interconnection wire 52, respectively. The amount of displacement is, for example, greater than or equal to 0.1×F1, and may be greater than or equal to 0.2×F1. The positions of the crest portions 25 and valley portions 26 of the second surface 22 of the substrate 20 may be displaced from the positions of the valley portions 24 and crest portions 23 of the first surface 21 of the substrate 20, respectively. The amount of displacement may be greater than or equal to, for example, 0.1×F2, and may be greater than or equal to 0.2×F2.

(Method for Manufacturing Wiring Board)

A method for manufacturing the wiring board 10 is described below with reference to FIGS. 7A through 7C.

Figure 7A:
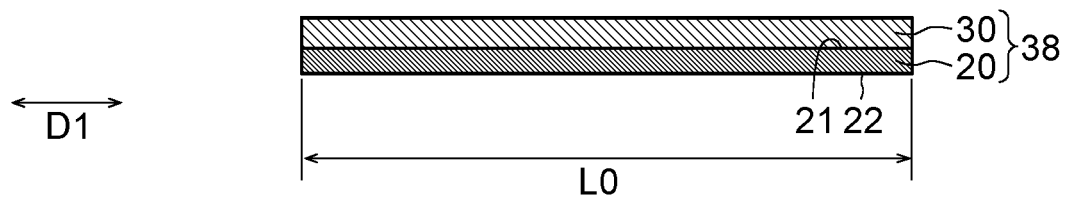
FIG. 7A illustrates a method for manufacturing a wiring board.

As illustrated in FIG. 7A, the stretchable laminate 38 including the substrate 20 and the stress relaxation layer 30 is prepared first. For example, the substrate 20 is prepared first. Thereafter, the material that constitutes the stress relaxation layer 30 is applied to the first surface 21 of the substrate 20, and the material is solidified. In this manner, the stretchable laminate 38 can be achieved.

Figure 7B:
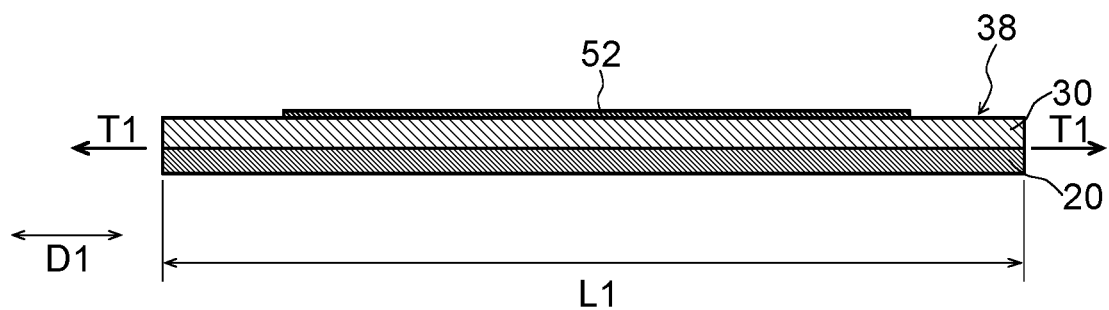
FIG. 7B illustrates a method for manufacturing a wiring board.

Subsequently, as illustrated in FIG. 7B, a stretch process is performed in which tension T is applied to the stretchable laminate 38 in the first direction D1 to stretch the stretchable laminate 38. The stretch ratio (=(L1−L0)×100/L0) of the entire stretchable laminate 38 is, for example, greater than or equal to 10% and less than or equal to 200%. The stretch process may be performed with the stretchable laminate 38 heated or at room temperature. When heating the stretchable laminate 38, the temperature of the stretchable laminate 38 is, for example, higher than or equal to 50° C. and lower than or equal to 100° C.

Subsequently, as illustrated in FIG. 7B, an interconnection wire formation process is performed to provide the interconnection wire 52 on the stress relaxation layer 30 of the stretchable laminate 38 that is being stretched by the tension T. For example, conductive paste containing the base material and conductive particles is printed on the stress relaxation layer 30.

Figure 7C:
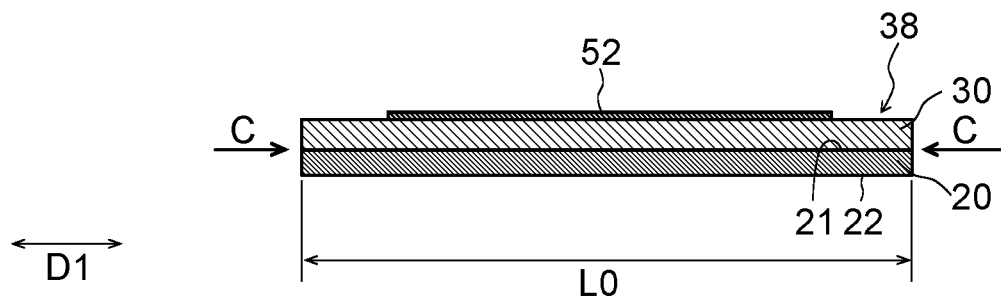
FIG. 7C illustrates a method for manufacturing a wiring board.

Subsequently, as illustrated in FIG. 7C, a contraction process is performed to remove the tension T from the stretchable laminate 38. Thus, the stretchable laminate 38 contracts in the first direction D1 indicated by arrow C in FIG. 7C, and deformation also occurs in the interconnection wire 52 provided on the stress relaxation layer 30 of the stretchable laminate 38. The deformation of the interconnection wire 52 can occur, resulting in formation of the undulating portion 55, as described above. In this way, the wiring board 10 having the undulating portion generated therein can be achieved.

According to the present embodiment, the interconnection wire 52 of the wiring board 10 has the undulating portion 55. Accordingly, when the stretchable laminate 38 of the wiring board 10 is stretched, the interconnection wire 52 can follow the stretch of the stretchable laminate 38 by deforming so as to reduce the undulations of the undulating portion 55, that is, by flattening the undulating shape. As a result, it is possible to suppress an increase in the total length of interconnection wire 52 and a decrease in the cross-sectional area of interconnection wire 52 caused by the stretch of the stretchable laminate 38. This can suppress an increase in the resistance value of the interconnection wire 52 caused by the stretch of the wiring board 10. In addition, the occurrence of cracks or other damage in the interconnection wire 52 can be reduced.

An example of the effect of the undulating portion 55 of the interconnection wire 52 on the electrical resistance value of the interconnection wire 52 is described below. In this example, the electrical resistance value of the interconnection wire 52 under a first condition in which no tension is applied to the stretchable laminate 38 in the first direction D1 is referred to as a first electrical resistance value. The resistance value of the interconnection wire 52 under a second condition in which tension is applied to the stretchable laminate 38 in the first direction D1 so that the stretchable laminate 38 is stretched by 30% as compared to the first condition is referred to as a second electrical resistance value. According to the present embodiment, by forming the undulating portion 55 in the interconnection wire 52, the ratio of the absolute value of the difference between the first and second electrical resistance values to the first electrical resistance value can be set to less than or equal to 20% and, more preferably to less than or equal to 10%, and even more preferably to less than or equal to 5%.

In addition, according to the present embodiment, the stress relaxation layer 30 having lower resilience than the substrate 20 is provided between the first surface 21 of the substrate 20 and the interconnection wire 52. As a result, even when the shape of the substrate 20 changes over time after the contraction process, the stress relaxation layer 30 can reduce the influence of the change on the interconnection wire 52. In this way, the occurrence of deformation of the undulating portion 55 of the interconnection wire 52 over time can be reduced.

Figure 8:
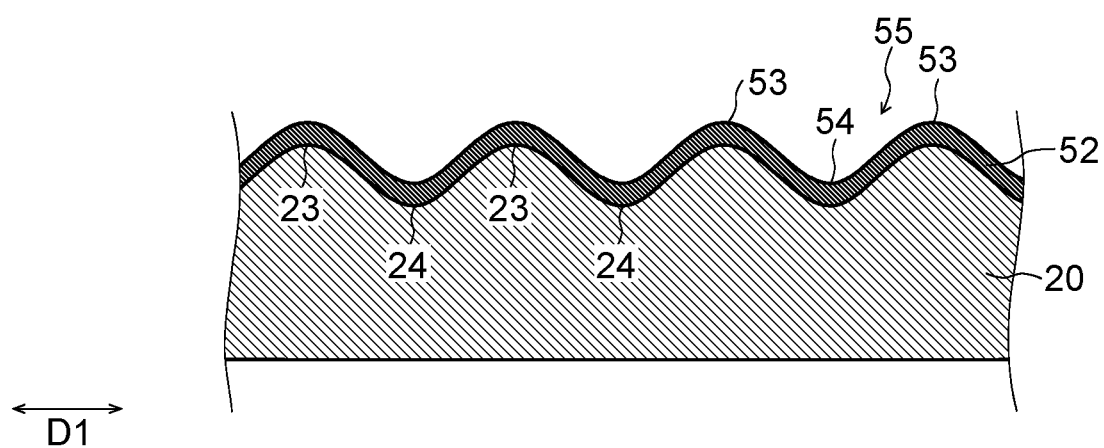
FIG. 8 is a sectional view of a wiring board according to a comparative example.
Figure 9:
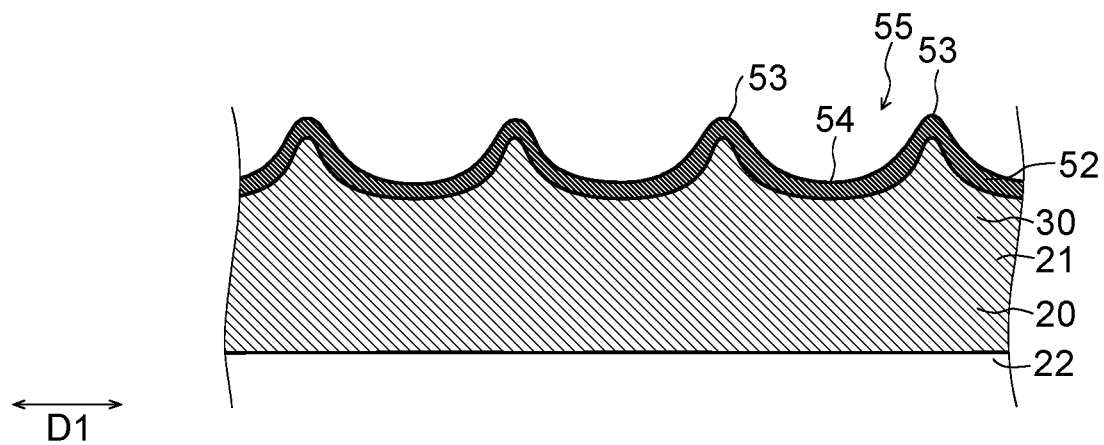
FIG. 9 is a sectional view illustrating an example of deformation that occurs in the wiring board over time according to the comparative example illustrated in FIG. 8.

For comparison purposes, the case where the stress relaxation layer 30 is not provided is discussed below. For example, the case where, as illustrated in FIG. 8, the interconnection wire 52 is provided on the first surface 21 of the substrate 20 is discussed. In this case, when the width of a crest portion 23 generated in the first surface 21 of the substrate 20 decreases due to the restorative force of the substrate 20, the radius of curvature of the crest portion 53 of the undulating portion 55 of the interconnection wire 52 decreases. This may result in an increase in the electrical resistance of the interconnection wire 52. In addition, if the radius of curvature of the crest portion 53 becomes too small, defects, such as breaking of wire, may occur in the interconnection wire 52.

In contrast, according to the present embodiment, by providing the stress relaxation layer 30 between the first surface 21 of the substrate 20 and the interconnection wire 52, the influence of the deformation of the first surface 21 of the substrate 20 over time on the interconnection wire 52 can be reduced. Thus, an increase in electrical resistance of the interconnection wire 52 over time can be suppressed. In addition, defects, such as breaking of wire, which occur in the interconnection wire 52 can be reduced.

Examples of an application field of the wiring board 10 include the healthcare field, medical field, nursing care field, electronics field, sports and fitness field, beauty field, mobility field, stockbreeding and pet field, amusement field, fashion and apparel field, security field, military field, distribution field, education field, building material/furniture/decoration field, environmental energy field, agriculture/forestry/fisheries field, and robotics field. For example, a product that is to be attached to a part of the human body, such as the human arm, is configured using the wiring board 10 according to the present embodiment. Since the wiring board 10 is stretchable, the wiring board 10 can be in tight contact with the human body, for example, by attaching the wiring board 10 that is stretched to the body. As a result, comfortable wearability can be achieved. In addition, since a decrease in resistance value of the interconnection wire 52 can be suppressed when the wiring board 10 is stretched, excellent electrical characteristics of the wiring board 10 can be achieved. Furthermore, since the wiring board 10 is stretchable, the wiring board 10 can be mounted or assembled not only along a living body, such as the human body, but also along a curved surface or a three-dimensional shape. Examples of such a product include a vital sensor, a mask, a hearing aid, a toothbrush, an adhesive plaster, a poultice, contact lenses, an artificial arm, an artificial leg, an artificial eye, a catheter, a gauze, a medicine pack, a bandage, a disposable bioelectrode, a diaper, rehabilitation equipment, a home appliance, a display, a signage, a personal computer, a cell phone, a mouse, a loudspeaker, sportswear, a wristband, a cloth headband, a glove, a swimwear, a jockstrap, a ball, a baseball glove, a racket, a golf club, a bat, a fishing rod, a relay baton, gymnastics equipment and its grip, physical training equipment, an inner tube, a tent, swimwear, a saddlecloth, a goal net, a goal tape, an osmotic medicinal beauty mask, an electro stimulation weight loss equipment product, a pocket body warmer, an artificial nail, a tattoo, seats of an automobile, an airplane, a railway train, a boat, a bicycle, a baby buggy, a drone, and a wheelchair, an instrument panel, a tire, an interior package, an exterior package, a saddle, a steering wheel, a road, a rail, a bridge, a tunnel, a gas or water pipe, an electric wire, a tetrapod, a rope collar, a leash, a harness, an animal tag, a bracelet, a belt, etc., a haptic device (such as a game device or a controller), a luncheon mat, a ticket, a doll, a stuffed animal, cheering goods, a hat, clothes, glasses, shoes, insoles, socks, stockings, slippers, inner wear, a muffler, earmuffs, a bag, an accessory, a ring, a watch, a tie, a personal ID recognition device, a helmet, a package, an IC tag, a plastic bottle, stationery, a book, a pen, a carpet, a sofa, bedclothes, an illumination lamp, a doorknob, an arm rail, a vase, a bed, a mattress, a cushion, a curtain, a door, a window, a ceiling, a wall, a floor, a wireless power transfer antenna, a battery, plastic greenhouses, a net, a robot hand, and a robot exterior.

It should be noted that various modifications can be made to the above-described embodiment. The modifications are described below with reference to the accompanying drawings as needed. In the following description and the drawings used in the following description, parts that can be configured in the same manner as in the above-described embodiment are identified by the same reference signs as those used for the corresponding parts in the above-mentioned embodiment, and repeated description is not given below. In addition, if it is clear that the effect obtained in the above-mentioned embodiment can also be obtained in the modification, description of the effect is not given below as needed.

First Modification

While the above-described embodiment has been described with reference to an example in which the interconnection wire 52 is provided on the stretchable laminate 38, but the configuration is not limited thereto. According to the present modification, an example in which the interconnection wire 52 is supported by a support substrate is described.

Figure 10:
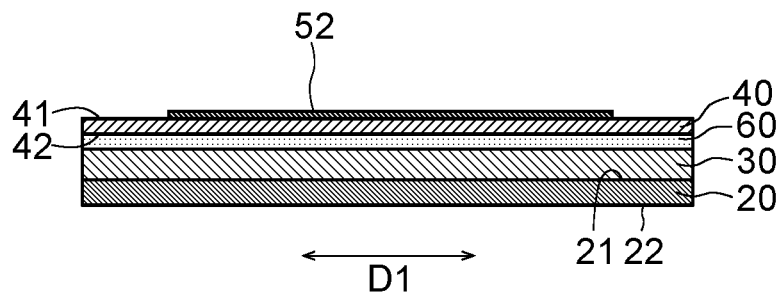
FIG. 10 is a sectional view of a wiring board according to a first modification.

FIG. 10 is a sectional view of a wiring board 10 according to the first modification, which corresponds to FIG. 2 according to the above-described embodiment. The wiring board 10 includes at least a substrate 20, a stress relaxation layer 30, a support substrate 40, and an interconnection wire 52.

[Support Substrate]

The support substrate 40 is a member configured to have a lower stretchability than the substrate 20. The support substrate 40 has a second surface 42 located adjacent to the stress relaxation layer 30 and a first surface 41 located on the opposite side of the second surface 42. In the example illustrated in FIG. 10, the support substrate 40 supports the interconnection wire 52 by the first surface 41 thereof. In addition, the second surface 42 of the support substrate 40 is joined to the stress relaxation layer 30 of the stretchable laminate 38. For example, an adhesive layer 60 including an adhesive agent may be provided between the stress relaxation layer 30 and the support substrate 40. Examples of a material that constitutes the adhesive layer 60 include an acrylic adhesive, a silicone adhesive, a siloxane primer, and a thiol primer. In addition to a molecular film produced by the liquid phase method, a molecular film produced by a gas phase method, such as HMDSO (hexamethyldisiloxane) or HMDS (hexamethyldisilazane), may be used as the adhesive layer 60. The thickness of the adhesive layer 60 is, for example, greater than or equal to 5 μm and less than or equal to 200 μm. The modulus of elasticity of the adhesive layer 60 may be higher than that of the stress relaxation layer 30.

Figure 11:
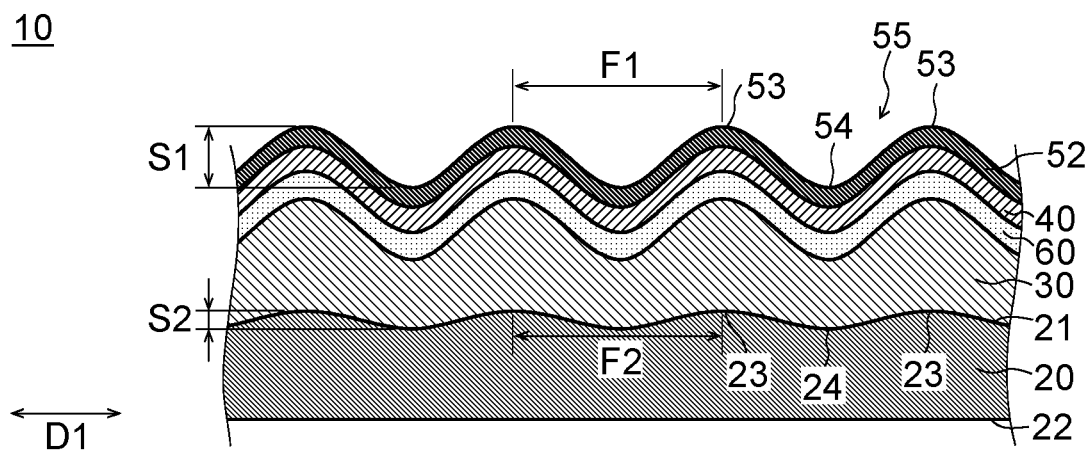
FIG. 11 is an enlarged sectional view of the wiring board illustrated in FIG. 10.

FIG. 11 is an enlarged sectional view of the wiring board 10 illustrated in FIG. 10. According to the present modification, when tension is removed from the stretchable laminate 38 joined to the support substrate 40 and, thus, the stretchable laminate 38 contracts, crest portions and valley portions similar to the crest portions and valley portions in the surface of the stress relaxation layer 30 of the stretchable laminate 38 appear in the support substrate 40. The properties and dimensions of the support substrate 40 are set to facilitate the formation of such crest portions and valley portions. For example, the support substrate 40 has a modulus of elasticity that is higher than the first modulus of elasticity of the substrate 20. In the following description, the modulus of elasticity of the support substrate 40 is also referred to as a third modulus of elasticity.

Although not illustrated, the support substrate 40 may support the interconnection wire 52 by the second surface 42 thereof.

The third modulus of elasticity of the support substrate 40 is, for example, higher than or equal to 100 MPa, and more preferably higher than or equal to 1 GPa. In addition, the third modulus of elasticity of the support substrate 40 may be higher than or equal to 100 times the first modulus of elasticity of the substrate 20 and lower than or equal to 50000 times the first modulus of elasticity, and preferably higher than or equal to 1000 times the first modulus of elasticity and lower than or equal to 10000 times the first modulus of elasticity. By setting the third modulus of elasticity of the support substrate 40 in this manner, the pitch F1 of the crest portions 53 and valley portions 54 can be inhibited from becoming too small. In addition, the occurrence of local bending of the crest portion 53 and the valley portion 54 can be reduced. Note that if the modulus of elasticity of the support substrate 40 is too low, the support substrate 40 tends to deform during the process of forming the interconnection wire 52, and, thus, it becomes difficult to align the interconnection wire 52 with the support substrate 40. In contrast, if the modulus of elasticity of the support substrate 40 is too high, it becomes difficult to return the substrate 20 to its original shape when the substrate 20 is relaxed. In addition, the substrate 20 is easy to crack or break.

The thickness of the support substrate 40 is, for example, greater than or equal to 500 nm and less than or equal to 10 μm, and more preferably greater than or equal to 1 μm and less than or equal to 5 μm. If the thickness of the support substrate 40 is too small, handling of the support substrate 40 becomes difficult in the process of manufacturing the support substrate 40 and in the process of forming a member, such as the interconnection wire 52, on the support substrate 40. If the thickness of the support substrate 40 is too large, it becomes difficult to return the substrate 20 to its original shape when the substrate 20 is relaxed and, thus, expected stretch and contraction of the substrate 20 is not able to be obtained.

Examples of a desirable material that constitutes the support substrate 40 include polyethylene naphthalate, polyimide, polyethylene terephthalate, polycarbonate, and acrylic resin. Among them, polyethylene naphthalate or polyimide, which has excellent durability and heat resistance, can be desirably used.

The third modulus of elasticity of the support substrate 40 may be lower than or equal to 100 times the first modulus of elasticity of the substrate 20. To calculate the third modulus of elasticity of the support substrate 40, a tensile test can be performed in accordance with ASTM D882 using a sample of the support substrate 40.

(Method for Manufacturing Wiring Board)

A method for manufacturing the wiring board 10 according to the present modification is described below with reference to FIGS. 12A through 12C.

Figure 12A:
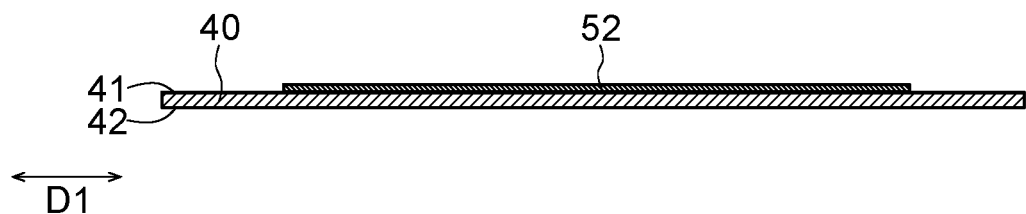
FIG. 12A illustrates a method for manufacturing the wiring board according to the first modification.
Figure 12B:
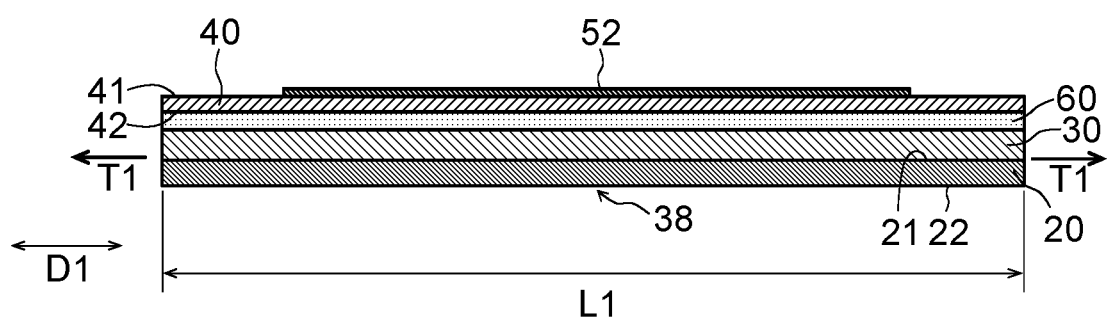
FIG. 12B illustrates a method for manufacturing the wiring board according to the first modification.
Figure 12C:
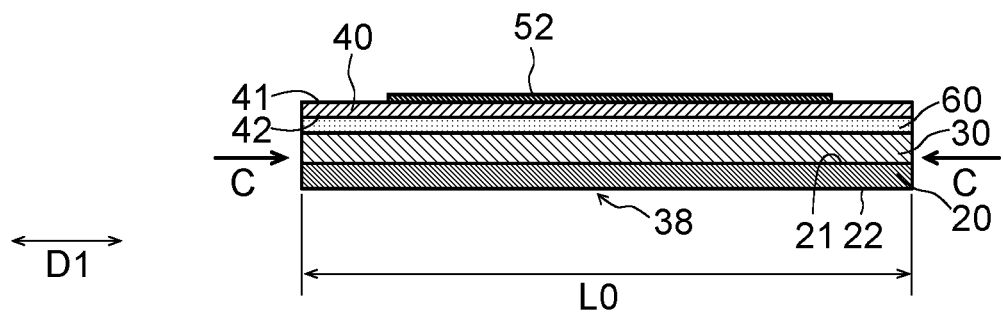
FIG. 12C illustrates a method for manufacturing the wiring board according to the first modification.

As illustrated in FIG. 12A, the support substrate 40 is prepared first. Thereafter, as illustrated in FIG. 12A, the interconnection wire 52 is provided on the first surface 41 of the support substrate 40. For example, a metal layer, such as a copper layer, is formed first on the first surface 41 of the support substrate 40 by vapor deposition, plating, or the like. Thereafter, the metal layer is processed using the photolithography method and the etching method. As a result, the interconnection wire 52 can be achieved on the first surface 41.

In addition, like the above-described embodiment, the stretchable laminate 38 including the substrate 20 and the stress relaxation layer 30 is prepared. Thereafter, as illustrated in FIG. 12B, a stretch process is performed in which the tension T is applied to the stretchable laminate 38 in the first direction D1 to stretch the stretchable laminate 38. Subsequently, an interconnection wire formation process is performed to provide the interconnection wire 52 on the stress relaxation layer 30 of the stretchable laminate 38 that is being stretched. In the interconnection wire formation process according to the present modification, as illustrated in FIG. 12B, the second surface 42 of the support substrate 40 having the interconnection wire 52 provided thereon is joined to the stress relaxation layer 30 of the stretchable laminate 38. At this time, the adhesive layer 60 may be provided between the stress relaxation layer 30 and the support substrate 40.

Subsequently, a contraction process is performed to remove the tension T from the stretchable laminate 38. As a result, the stretchable laminate 38 contracts in the first direction D1 as indicated by arrow C in FIG. 12C, and deformation also occurs in the support substrate 40 and the interconnection wire 52 provided on the stretchable laminate 38. The deformation of the support substrate 40 and the interconnection wire 52 can occur, resulting in formation of an undulating portion, as described above.

According to the present modification, the stress relaxation layer 30 having a lower resilience than the substrate 20 is provided between the first surface 21 of the substrate 20 and the support substrate 40 and interconnection wire 52. Accordingly, even if the shape of the substrate 20 changes over time after the contraction process, the stress relaxation layer 30 can reduce the influence of the change on the support substrate 40 and interconnection wire 52. As a result, deformation of the undulating portion 55 of the interconnection wire 52 that occurs over time can be reduced.

Second Modification

Figure 13:
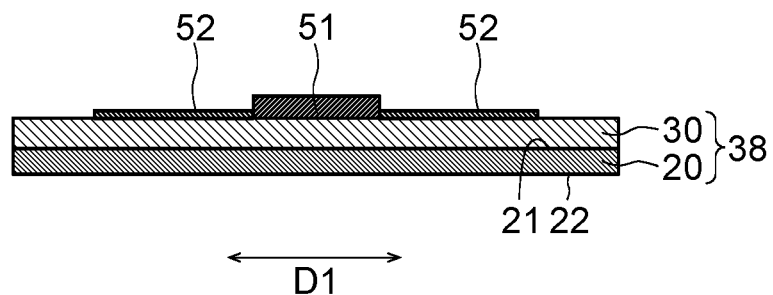
FIG. 13 is a sectional view of a wiring board according to a second modification.

FIG. 13 illustrates a plan view of a wiring board 10 according to the present modification. As illustrated in FIG. 13, the wiring board 10 may include an electronic component 51 electrically connected to the interconnection wire 52. Alternatively, the wiring board 10 may be configured so as to enable an electronic component 51, which is to be electrically connected to the interconnection wire 52, to be mounted thereon, although no electronic components 51 has mounted thereon.

The electronic component 51 may have an electrode that is connected to the interconnection wire 52. In this case, the wiring board 10 has a connection portion that is in contact with the electrode of the electronic component 51 and that is electrically connected to the interconnection wire 52. An example of the connection portion is a pad.

Alternatively, the electronic component 51 does not necessarily have to have an electrode that is to be connected to the interconnection wire 52. For example, the electronic component 51 may include a member that is integrated with at least one of the plurality of constituent elements of the wiring board 10. Examples of such an electronic component 51 include one that includes a conductive layer integrated with a conductive layer constituting an interconnection wire 52 of the wiring board 10 and one that includes a conductive layer located in a layer different from the conductive layer constituting the interconnection wire 52. For example, the electronic component 51 may be a pad composed of a conductive layer having a wider width in plan view than the conductive layer constituting the interconnection wire 52. The pad enables a probe for inspection, a terminal for software rewriting, or the like to be connected thereto. Alternatively, the electronic component 51 may be a wiring pattern composed of a conductive layer extending in a spiral shape in plan view. As described above, a portion of the conductive layer that has been patterned and given a predetermined function can also be an electronic component 51.

The electronic component 51 may be an active component, a passive component, or a mechanism element. Examples of an electronic component 51 include a transistor, an LSI (Large-Scale Integration), MEMS (Micro Electro Mechanical Systems), a relay, a light-emitting device, such as an LED, an OLED, and an LCD, a sensor, a sound-emitting component, such as a buzzer, a vibration component that emits vibration, a cooling/heating component, such as a Peltier device that controls cooling and heating or a heating wire, a resistor, a capacitor, an inductor, a piezoelectric device, a switch, and a connector. Among the above-mentioned examples of an electronic component 51, a sensor is desirably used. Examples of a sensor include a temperature sensor, a pressure sensor, an optical sensor, a photoelectric sensor, a proximity sensor, a shear force sensor, a biometric sensor, a laser sensor, a microwave sensor, a humidity sensor, a strain sensor, a gyro sensor, an acceleration sensor, a displacement sensor, a magnetic sensor, a gas sensor, a GPS sensor, an ultrasonic sensor, an odor sensor, an electroencephalographic sensor, a current sensor, a vibration sensor, a pulse wave sensor, an electrocardiographic sensor, and a photometric sensor. Of these sensors, a biometric sensor is particularly desirable. Biometric sensors can measure biometric information, such as heartbeat, pulse, electrocardiogram, blood pressure, body temperature, and a blood oxygen level.

The applications of an electronic component 51 that does not have an electrode are described below. For example, the pad described above can function as a part to which a probe for inspection, a terminal for software rewriting, or the like is to be connected. In addition, the wiring pattern formed by extending in a spiral shape can function as an antenna or the like.

Third Modification

Figure 14:
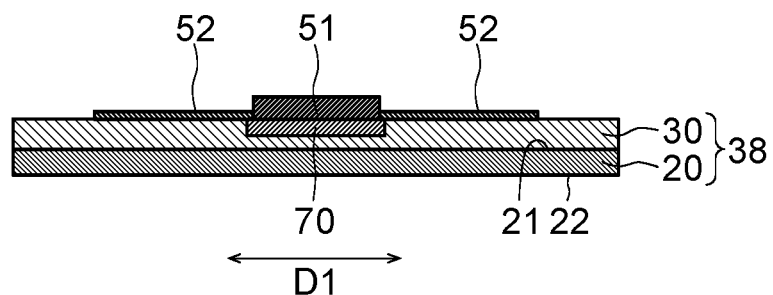
FIG. 14 is a sectional view of a wiring board according to a third modification.

FIG. 14 is a plan view of a wiring board 10 according to the present modification. The wiring board 10 may include a reinforcing member 70. The reinforcing member 70 is a member for reducing the stress being placed on the electronic component 51 when the wiring board 10 is stretched or contracted. The reinforcing member 70 is disposed so as to at least partially overlap the electronic component 51 in plan view as viewed in the direction normal to the first surface 21 of the substrate 20. In addition, the reinforcing member 70 has a modulus of elasticity higher than that of the substrate 20.

The modulus of elasticity of the reinforcing member 70 is, for example, higher than or equal to 1 GPa, and more preferably higher than or equal to 10 GPa. The modulus of elasticity of the reinforcing member 70 may be higher than or equal to 100 times the modulus of elasticity of the substrate 20, or higher than or equal to 1000 times the modulus of elasticity. The wiring board 10 including such a reinforcing member 70 can inhibit the portion of the stretchable laminate 38 that overlaps the reinforcing member 70 in plan view from being stretched and contracted. As a result, the stretchable laminate 38 can be partitioned into portions that are easy to stretch and portions that are not easy to stretch. The modulus of elasticity of the reinforcing member 70 may be lower than or equal to 500 GPa. In addition, the modulus of elasticity of the reinforcing member 70 may be lower than or equal to 500000 times the modulus of elasticity of the substrate 20.

The method for calculating the modulus of elasticity of the reinforcing member 70 can be determined in accordance with the configuration of the reinforcing member 70. For example, to calculate the modulus of elasticity of the reinforcing member 70, the above-described method for calculating the modulus of elasticity of the support substrate 40 can be used.

In addition, the reinforcing member 70 may have a bending stiffness that is greater than the bending stiffness of the substrate 20. The bending stiffness of the reinforcing member 70 may be greater than or equal to 100 times the bending stiffness of the substrate 20, or greater than or equal to 1000 times.

Examples of a material that constitutes the reinforcing member 70 include a metallic layer including a metallic material, general thermoplastic elastomers, and oligomers and polymers such as acrylic, urethane, epoxy, polyester, epoxy, vinyl ether, polyene/thiol, silicone, and the like. Examples of a metallic material include copper, aluminum, stainless steel, and the like. The thickness of the reinforcing member 70 is, for example, greater than or equal to 10 μm. Among the above-mentioned materials, the metal layer is more desirable because it has a large modulus of elasticity and can be finely processed by etching or other processes.

The reinforcing member 70 may contain, as its primary component, an elastomer that is the same as the elastomer contained in the substrate 20 as the primary component. The elastomer of the reinforcing member 70 can be that described as the example of the elastomer of the substrate 20.

When oligomer or polymer is used as the material constituting the reinforcing member 70, the reinforcing member 70 may have transparency. Alternatively, the reinforcing member 70 may further have light blocking properties, for example, properties for blocking ultraviolet light. For example, the reinforcing member 70 may be black. The color of the reinforcing member 70 may be the same as the color of the substrate 20 and the stress relaxation layer 30 of the stretchable laminate 38.

The reinforcing member 70 may be provided on the stretchable laminate 38 prior to the stretch process in which the stretchable laminate 38 is stretched. Alternatively, the reinforcing member 70 may be provided on the stretchable laminate 38 while the stretchable laminate 38 is being stretched in the stretch process.

As illustrated in FIG. 14, the reinforcing member 70 may have a surface that is flush with the surface of the stress relaxation layer 30 adjacent to the interconnection wire 52. Such a reinforcing member 70 can be produced, for example, by partially providing the reinforcing member 70 on a predetermined support surface and, thereafter, applying the material that constitutes the stress relaxation layer 30 onto the surface of the reinforcing member 70 and the surface of the support surface and, thereafter, applying the material that constitutes the substrate 20 onto the surface of the stress relaxation layer 30.

As illustrated in FIG. 14, the interconnection wire 52 may have an end portion that overlaps the reinforcing member 70 in plan view as viewed in the direction normal to the first surface 21 of the substrate 20. As a result, in the vicinity of the end portion of the interconnection wire 52, that is, in the vicinity of a portion of the interconnection wire 52 connected to the electronic component 51, the occurrence of stress due to stretch and contraction of the stretchable laminate 38 can be reduced.

Fourth Modification

Figure 15:
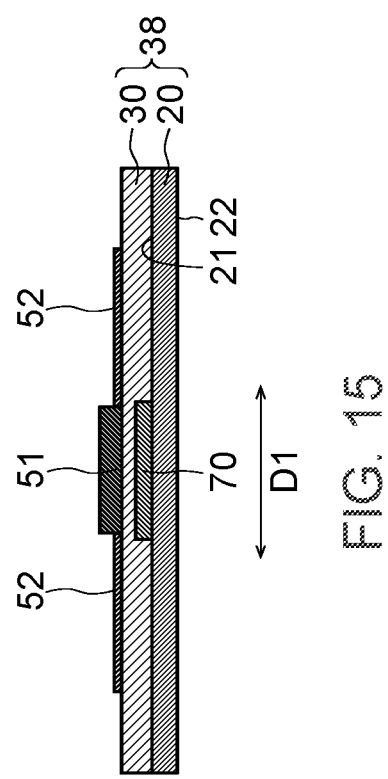
FIG. 15 is a sectional view of a wiring board according to a fourth modification.

FIG. 15 is a plan view of a wiring board 10 according to the present modification. As illustrated in FIG. 15, a surface of the reinforcing member 70 that is located adjacent to the interconnection wire 52 may be covered by the stress relaxation layer 30. Such a reinforcing member 70 can be produced, for example, by preparing a substrate 20 first and, thereafter, partially providing the reinforcing member 70 on the first surface 21 of the substrate 20 and, thereafter, applying the material that constitutes the stress relaxation layer 30 onto the surface of the reinforcing member 70 and the first surface 21 of the substrate 20.

Fifth Modification

Figure 16:
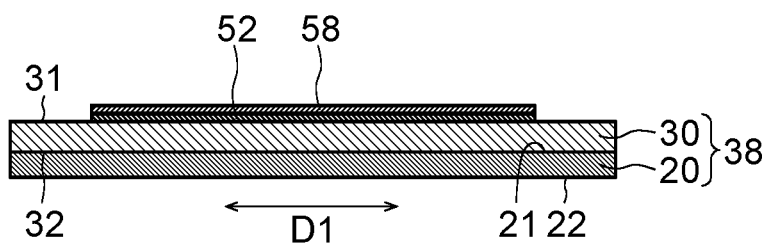
FIG. 16 is a sectional view of a wiring board according to a fifth modification.

FIG. 16 is a plan view of a wiring board 10 according to the present modification. As illustrated in FIG. 16, the wiring board 10 may include a protective layer 58 located on the interconnection wire 52. The protective layer 58 may have the same shape as the interconnection wire 52 in plan view. For example, the protective layer 58 may extend in the same direction as the interconnection wire 52 in plan view and may have the same width as the interconnection wire 52. Alternatively, the protective layer 58 may be located on and around the interconnection wire 52 so as to cover the top surface and the side surfaces of the interconnection wire 52.

It is desirable that the protective layer 58 have a modulus of elasticity that is smaller than that of the interconnection wire 52. The protective layer 58 located on and around the interconnection wire 52 may have an undulating portion in which crest portions and valley portions each extending in the direction normal to the first surface 21 of the substrate 20 repeatedly appear in an in-plane direction of the first surface 21 of the substrate 20.

In addition, it is desirable that the modulus of elasticity of the protective layer 58 be higher than the modulus of elasticity of the elastic substrate 20. That is, it is desirable that the protective layer 58 have a modulus of elasticity of a value intermediate between the moduli of elasticity of the interconnection wire 52 and the substrate 20. The protective layer 58 is softer and is easy to deform than the interconnection wire 52. In addition, the protective layer 58 is harder and is not easy to deform than the substrate 20. Furthermore, the protective layer 58 is located in an area where the interconnection wire 52 is provided at the first surface 21 side of the substrate 20. Accordingly, stress concentration can be reduced.

When the wiring board 10 has a support substrate 40, the modulus of elasticity of the protective layer 58 may be lower than the modulus of elasticity of the support substrate 40, may be the same as the modulus of elasticity of the support substrate 40, or may be higher than the modulus of elasticity of the support substrate 40. Among the relationships, it is desirable that the modulus of elasticity of the protective layer 58 be lower than that of the support substrate 40. Since the protective layer 58, which is softer and is easy to deform than the interconnection wire 52 and the support substrate 40, is located in an area where the interconnection wire 52 is provided at the first surface 21 side of the substrate 20, stress concentration can be reduced.

More specifically, the modulus of elasticity of the protective layer 58 can be lower than 1 times the modulus of elasticity of the interconnection wire 52, preferably lower than or equal to 0.9 times, more preferably lower than or equal to 0.1 times, and even more preferably lower than or equal to 0.05 times. In addition, the modulus of elasticity of the protective layer 58 can be higher than or equal to 0.001 times the modulus of elasticity of the interconnection wire 52, and is preferably higher than or equal to 0.01 times. In addition, the modulus of elasticity of the protective layer 58 can be higher than 1 times the modulus of elasticity of the stretchable substrate 20, and is preferably higher than or equal to 1.1 times, and more preferably higher than or equal to 2 times. Furthermore, the modulus of elasticity of the protective layer 58 can be lower than or equal to 100 times the modulus of elasticity of the stretchable substrate, and preferably lower than or equal to 10 times. This is because if the modulus of elasticity of the protective layer 58 is too small or too large, it may be difficult to reduce stress concentration.

The modulus of elasticity of the protective layer 58 can be, for example, lower than or equal to 1 GPa, preferably lower than or equal to 100 MPa, and more preferably lower than or equal to 10 MPa. In addition, the modulus of elasticity of the protective layer 58 can be, for example, higher than or equal to 10 kPa, and is preferably higher than or equal to 1 MPa. This is because if the modulus of elasticity of the protective layer 58 is too small or too large, it may be difficult to reduce stress concentration.

Like the case of the substrate 20, to measure the modulus of elasticity of the protective layer 58, a method can be employed in which a tensile test is performed in accordance with JIS K6251 using a sample of the protective layer 58. In addition, like the case of the substrate 20, to determine the modulus of elasticity of the protective layer 58, the ISO 14577 standard nanoindentation method can be employed. To prepare a sample of the protective layer 58, a method for taking out part of the protective layer 58 from the wiring board 10 as a sample, or a method for taking out part of the protective layer 58 as a sample before the wiring board 10 is configured is employed. In addition, to determine the modulus of elasticity of the protective layer 58, a method is employed in which the material that constitutes the protective layer 58 is analyzed and searching an existing database of materials for the modulus of elasticity of the protective layer 58 on the basis of the material.

Any material that has the above-described modulus of elasticity can be the material for the protective layer 58. The material for the protective layer 58 may be stretchable or non-stretchable. It is desirable that the material for the protective layer 58 be stretchable. This is because if the protective layer 58 includes a material having stretchability, the protective layer 58 can be resistant to deformation.

An example of a non-stretchable material used for the protective layer 58 is a resin, and any widely used resin can be used. For example, any one of a thermoplastic resin, a thermosetting resin, and a photosetting resin can be used. When the protective layer 58 includes a resin, a resin substrate can be used as the protective layer 58.

The stretchability of a stretchable material used for the protective layer 58 can be the same as the stretchability of the substrate 20. An example of a stretchable material used for the protective layer 58 is an elastomer. Widely used thermoplastic elastomer or thermosetting elastomer can be used. More specifically, examples of an elastomer used include styrenic elastomer, olefinic elastomer, urethane elastomer, amide elastomer, silicone rubber, urethane rubber, fluoro rubber, polybutadiene, polyisobutylene, polystyrene butadiene, and polychloroprene. When the material that constitutes the protective layer 58 is one of these resins, the protective layer 58 may be transparent. Alternatively, the protective layer 58 may have light-blocking characteristics, for example, ultraviolet light blocking characteristics. For example, the protective layer 58 may be black. The color of the protective layer 58 may be the same as the color of the board. The protective layer 58 may have designability and serve as a decoration.

When the protective layer 58 is in contact with the interconnection wire 52, it is desirable that the protective layer 58 have insulating properties. A resin or elastomer can be used to make the protective layer 58 with insulating properties.

Sixth Modification

Figure 17:
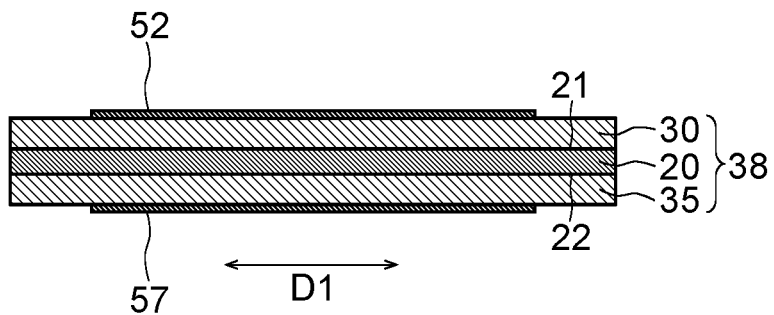
FIG. 17 is a sectional view of a wiring board according to a sixth modification.

FIG. 17 is a plan view of a wiring board 10 according to the present modification. As illustrated in FIG. 17, in addition to including the stress relaxation layer (first stress relaxation layer) 30 located adjacent to the first surface 21 of the substrate 20, the stretchable laminate 38 may include a stress relaxation layer (a second stress relaxation layer) 35 located adjacent to the second surface 22 of the substrate 20. The range of the modulus of elasticity of the second stress relaxation layer 35 is the same as the range described above for the first stress relaxation layer 30. In addition, the range of thickness of the second stress relaxation layer 35 is the same as the range described above for the first stress relaxation layer 30.

By providing the second stress relaxation layer 35 adjacent to the second surface 22 of the substrate 20, it can be reduced that the influence of a change in the shape of the substrate 20 over time appears in the surface of the wiring board 10 adjacent to the second stress relaxation layer 35. As a result, for example, when forming a second interconnection wire 57 in the surface of the wiring board 10 adjacent to the second stress relaxation layer 35, the occurrence of deformation of the second interconnection wire 57 over time can be reduced.

While several modifications of the above-described embodiment have been described, it is appreciated that some of the modifications can be combined as appropriate and be applied.

EXAMPLES

The present invention is described in more detail below with reference to examples and a comparative example. Note that the invention should not be construed as being limited to the examples described below unless the invention departs from the scope thereof.

Example 1

(Preparation of Stretchable Substrate)

An adhesive sheet that functions as the adhesive layer 60 was placed on a support stand. As the adhesive sheet, adhesive sheet 8146 available from 3M Company was used. Subsequently, first polydimethylsiloxane (PDMS-1) of two-liquid addition-condensation was applied onto the adhesive sheet, and PDMS-1 was temporarily cured at room temperature to form the stress relaxation layer 30 consisting of a layer of PDMS-1. Subsequently, second polydimethylsiloxane (PDMS-2) of two-liquid addition-condensation that differs from PDMS-1 was applied onto the stress relaxation layer 30, and PDMS-2 was heated and cured to form the substrate 20 consisting of a layer of PDMS-2. In this way, the stretchable laminate 38 including the substrate 20 and the stress relaxation layer 30 was obtained. The thickness of the layer of PDMS-1 after curing was 0.5 mm, and the thickness of the layer of PDMS-2 after curing was 1.0 mm. That is, the thickness of the stress relaxation layer 30 is 0.50 times the thickness of the substrate 20.

In addition, a sample consisting of a layer of PDMS-1 was prepared, and the modulus of elasticity of the layer of PDMS-1 was measured by a tensile test in accordance with JIS K6251. The measurement result indicates that the modulus of elasticity of the PDMS-1 layer is 0.02 MPa. Furthermore, the hardness of the layer of PDMS-1 was measured by a type A durometer hardness test in accordance with JIS K6253-1997. As a result of measurement, the hardness of the PDMS-1 layer was durometer A3. In addition, a sample consisting of a layer of PDMS-2 was prepared, and the modulus of elasticity of the layer of PDMS-2 was measured by a tensile test in accordance with JIS K6251. As a result of measurement, the modulus of elasticity of the layer of PDMS-2 was 0.05 MPa. That is, the modulus of elasticity of the stress relaxation layer 30 is 0.40 times the modulus of elasticity of the substrate 20. The hardness of the layer of PDMS-2 was measured by a type A durometer hardness test in accordance with JIS K6253-1997. As a result of measurement, the hardness of the PDMS-1 layer was durometer A5.

(Preparation of Support Substrate and Interconnection Wire)

A polyethylene terephthalate (PET) film having a thickness of 2.5 μm was prepared as the support substrate 40. Subsequently, a copper layer having a thickness of 1 μm was formed on the first surface 41 of the support substrate 40 using the vapor deposition method. Subsequently, the copper layer was processed using the photolithography method and the etching method. As a result, the interconnection wire 52 extending in one direction was obtained. The length of the interconnection wire 52 was 40 mm, and the width of the interconnection wire 52 was 200 μm.

Subsequently, ink containing dissolved urethane resin was applied to the interconnection wire 52 formed on the support substrate 40 by the screen printing method to form the protective layer 58 on the interconnection wire 52. The protective layer 58 had the same shape as the interconnection wire 52 in plan view. That is, the length of the protective layer 58 was 40 mm, and the width of the protective layer 58 was 200 μm.

Part of the support substrate 40 was taken out as a sample, and the modulus of elasticity of the support substrate 40 was measured by a tensile test in accordance with ASTM D882. As a result of measurement, the modulus of elasticity of the support substrate 40 was 10 GPa. In addition, part of the protective layer 58 was taken out as a sample, and the modulus of elasticity of the protective layer 58 was measured by a tensile test in accordance with ASTM D882. As a result of measurement, the modulus of elasticity of the protective layer 58 was 6.2 MPa.

(Bonding of Stretchable Laminate and Support Substrate)

Tension was applied to the stretchable laminate 38 having the adhesive layer 60 formed thereon in the direction in which the interconnection wire 52 extends so as to stretch the stretchable laminate 38 and the adhesive layer 60 by 1000% in the first direction D1. That is, the stretchable laminate 38 was stretched to twice its original length. Subsequently, of the two surfaces of the support substrate 40 having the interconnection wire 52 and the protective layer 58 provided thereon, the surface not having the interconnection wire 52 and the protective layer 58 thereon was bonded to the adhesive layer 60 with the stretchable laminate 38 being stretched to twice its original length.

Subsequently, the tension was removed to release the stretch and, thus, contraction of the stretchable laminate 38 was enabled. In this manner, the wiring board 10 was produced. In the obtained wiring board 10, an undulating portion appeared in each of the support substrate 40, the interconnection wire 52 provided on the support substrate 40, and the protective layer 58, and the undulating portion included a plurality of crest portions and valley portions aligned in the direction in which the interconnection wire 52 extends.

Immediately after the stretchable laminate 38 contracted, the radii of curvature of the crest portions and the valley portions were measured over five pitches of the plurality of crest portions and valley portions. As a result of measurement, the average value of the radius of curvature of the crest portion was 241 μm, the maximum value was 273 μm, and the minimum value was 207 μm. The average value of the radius of curvature of the valley portion was 381 μm, the maximum value was 493 μm, and the minimum value was 331 μm.

After 24 hours had elapsed at room temperature since contraction of the stretchable laminate 38, the radii of curvature of the crest portions and the valley portions were measured over five pitches of the plurality of crest portions and valley portions. As a result of measurement, the average value of the radius of curvature of the crest portion was 190 μm, and the average value of the radius of curvature of the valley portion was 397 μm. Therefore, the change ratios of the radius of curvature of the crest portion and the valley portion before and after 24 hours are −21.2% and +4.2%, respectively.

Example 2

Like Example 1, an adhesive sheet functioning as an adhesive layer 60 was placed on a support stand. Subsequently, the above-described PDMS-1 was applied onto the adhesive sheet, and the PDMS-1 was temporarily cured at room temperature to form the stress relaxation layer 30 consisting of a layer of PDMS-1 having a modulus of elasticity of 0.02 MPa. Subsequently, third polydimethylsiloxane (PDMS-3) having greater stretchability than PDMS-1 was applied onto the stress relaxation layer 30, and PDMS-3 was heated and cured to form a substrate 20 consisting of a layer of PDMS-3. In this way, a stretchable laminate 38 including the substrate 20 and the stress relaxation layer 30 was obtained. The thickness of the layer of PDMS-1 after curing was 0.5 mm, and the thickness of the layer of PDMS-3 after curing was 0.3 mm. That is, the thickness of the stress relaxation layer 30 is 1.67 times the thickness of the substrate 20.

In addition, a sample consisting of a layer of PDMS-3 was prepared, and the modulus of elasticity of the layer of PDMS-3 was measured by a tensile test in accordance with JIS K6251. As a result of measurement, the modulus of elasticity of the layer of PDMS-3 was 0.7 MPa. That is, the modulus of elasticity of the stress relaxation layer 30 is 0.03 times the modulus of elasticity of the substrate 20. In addition, the hardness of the layer of PDMS-3 was measured by the Type D durometer hardness test in accordance with JIS K6253-1997. As a result of measurement, the hardness of the PDMS-3 layer was durometer D30.

Subsequently, like Example 1, of the two surfaces of the support substrate 40 having the interconnection wire 52 and the protective layer 58 provided thereon, the surface of the support substrate 40 not having the interconnection wire 52 and the protective layer 58 thereon was bonded to the adhesive layer 60 with the stretchable laminate 38 being stretched to twice its length. Thereafter, the tension was removed to release the stretch and, thus, contraction of the stretchable laminate 38 was enabled. In this manner, the wiring board 10 was produced.

Immediately after the stretchable laminate 38 contracted, the radii of curvature of the crest portions and the valley portions were measured over five pitches of the plurality of crest portions and valley portions. As a result of measurement, the average value of the radius of curvature of the crest portion was 239 μm. In addition, the average value of the radius of curvature of the valley portion was 394 μm.

After 24 hours had elapsed at room temperature since contraction of the stretchable laminate 38, the radii of curvature of the crest portions and the valley portions were measured over five pitches of the plurality of crest portions and valley portions. As a result of measurement, the average value of the radius of curvature of the crest portion was 188 μm, and the average value of the radius of curvature of the valley portion was 401 μm. Therefore, the change ratios of the radius of curvature of the crest portion and the valley portion before and after 24 hours are −21.3% and +1.8%, respectively.

Example 3

The wiring board 10 was produced in the same manner as in Example 2 except that the stress relaxation layer 30 consisting of a PDMS-1 layer had a thickness of 0.3 mm. That is, in this example, the thickness of the stress relaxation layer 30 is 1.00 times the thickness of the substrate 20.

Immediately after the stretchable laminate 38 contracted, the radii of curvature of the crest portions and the valley portions were measured over five pitches of the plurality of crest portions and valley portions. As a result of measurement, the average value of the radius of curvature of the crest portion is 226 μm. The average value of the radius of curvature of the valley portion is 388 μm.

After 24 hours had elapsed at room temperature since contraction of the stretchable laminate 38, the radii of curvature of the crest portions and the valley portions were measured over five pitches of the plurality of crest portions and valley portions. As a result of measurement, the average value of the radius of curvature of the crest portion was 142 μm, and the average value of the radius of curvature of the valley portion was 423 μm. Therefore, the change ratios of the radius of curvature of the crest portion and the valley portion before and after 24 hours are −37.2% and +9.0%, respectively.

Example 4

Like Example 1, an adhesive sheet functioning as an adhesive layer 60 was placed on a support stand. Subsequently, the above-described PDMS-1 was applied onto the adhesive sheet, and the PDMS-1 was temporarily cured at room temperature to form the stress relaxation layer 30 consisting of a layer of PDMS-1 having a modulus of elasticity of 0.02 MPa. Subsequently, fourth polydimethylsiloxane (PDMS-4) having greater stretchability than PDMS-1 was applied onto the stress relaxation layer 30, and PDMS-4 was heated and cured to form a substrate 20 consisting of a PDMS-4 layer. In this way, a stretchable laminate 38 including the substrate 20 and the stress relaxation layer 30 was obtained. The thickness of the layer of PDMS-1 after curing was 0.5 mm, and the thickness of the layer of PDMS-4 after curing was 1.0 mm. That is, the thickness of the stress relaxation layer 30 is 0.50 times the thickness of the substrate 20.

In addition, a sample consisting of a layer of PDMS-4 was prepared, and the modulus of elasticity of the layer of PDMS-4 was measured by a tensile test in accordance with JIS K6251. As a result of measurement, the modulus of elasticity of the layer of PDMS-4 was 0.08 MPa. That is, the modulus of elasticity of the stress relaxation layer 30 is 0.25 times the modulus of elasticity of the substrate 20. In addition, the hardness of the layer of PDMS-4 was measured by the Type A durometer hardness test in accordance with JIS K6253-1997. As a result of measurement, the hardness of the PDMS-4 layer was durometer A10.

Subsequently, like Example 1, of the two surfaces of the support substrate 40 having the interconnection wire 52 and the protective layer 58 provided thereon, the surface not having the interconnection wire 52 and the protective layer 58 mounted thereon was bonded to the adhesive layer 60 with the stretchable laminate 38 being stretched to twice its length. Thereafter, the tension was removed to release the stretch and, thus, contraction of the stretchable laminate 38 was enabled. In this manner, the wiring board 10 was produced.

Immediately after the stretchable laminate 38 contracted, the radii of curvature of the crest portions and the valley portions were measured over five pitches of the plurality of crest portions and valley portions. As a result of measurement, the average value of the radius of curvature of the crest portion was 245 μm. In addition, the average value of the radius of curvature of the valley portion was 388 μm.

After 24 hours had elapsed at room temperature since contraction of the stretchable laminate 38, the radii of curvature of the crest portions and the valley portions were measured over five pitches of the plurality of crest portions and valley portions. As a result of measurement, the average value of the radius of curvature of the crest portion was 195

μm, and the average value of the radius of curvature of the valley portion was 397 μm. Therefore, the change ratios of the radius of curvature of the crest portion and the valley portion before and after 24 hours are −20.4% and +2.3%, respectively.

Example 5

Like Example 1, an adhesive sheet functioning as an adhesive layer 60 was placed on a support stand. Subsequently, a gel consisting of silicone was applied to the adhesive sheet to form a stress relaxation layer 30 consisting of the gel. Thereafter, the above-described PDMS-2 was applied onto the stress relaxation layer 30, and the PDMS-2 was heated and cured to form a substrate 20 consisting of a layer of PDMS-2 having a modulus of elasticity of 0.05 MPa. In this way, a stretchable laminate 38 including the substrate 20 and the stress relaxation layer 30 was obtained. The thickness of the gel was 0.3 mm, and the thickness of the layer of PDMS-2 after curing was 1.0 mm. That is, the thickness of the stress relaxation layer 30 is 0.30 times the thickness of the substrate 20. In addition, the hardness of the layer of silicone gel was measured by a type A durometer hardness test in accordance with JIS K6253-1997. As a result of measurement, the hardness of the silicone gel layer was durometer A1. In addition, the penetration was 65.

Subsequently, like Example 1, of the two surfaces of the support substrate 40 having the interconnection wire 52 and the protective layer 58 provided thereon, the surface of the support substrate 40 not having the interconnection wire 52 and the protective layer 58 thereon was bonded to the adhesive layer 60 with the stretchable laminate 38 being stretched to twice its length. Thereafter, the tension was removed to release the stretch and, thus, contraction of the stretchable laminate 38 was enabled. In this manner, the wiring board 10 was produced.

Immediately after the stretchable laminate 38 contracted, the radii of curvature of the crest portions and the valley portions were measured over five pitches of the plurality of crest portions and valley portions. As a result of measurement, the average value of the radius of curvature of the crest portion was 220 μm. In addition, the average value of the radius of curvature of the valley portion was 524 μm.

After 24 hours had elapsed at room temperature since contraction of the stretchable laminate 38, the radii of curvature of the crest portions and the valley portions were measured over five pitches of the plurality of crest portions and valley portions. As a result of measurement, the average value of the radius of curvature of the crest portion was 190 μm, and the average value of the radius of curvature of the valley portion was 533 μm. Therefore, the change ratios of the radius of curvature of the crest portion and the valley portion before and after 24 hours are −13.6% and +1.7%, respectively.

Comparative Example 1

Like Example 1, an adhesive sheet functioning as the adhesive layer 60 was placed on a support stand. Subsequently, the above-described PDMS-2 was applied onto the adhesive sheet, and the PDMS-2 was cured to form a substrate 20 consisting of a layer of PDMS-2 having a modulus of elasticity of 0.05 MPa. In this way, a stretchable laminate 38 including the substrate 20 but not the stress relaxation layer 30 was obtained. The thickness of the PDMS-2 after curing was 1.5 mm.

Subsequently, like Example 1, of the two surfaces of the support substrate 40 having the interconnection wire 52 and the protective layer 58 provided thereon, the surface of the support substrate 40 not having the interconnection wire 52 and the protective layer 58 thereon was bonded to the adhesive layer 60 with the stretchable laminate 38 being stretched to twice its length. Thereafter, the tension was removed to release the stretch and, thus, contraction of the stretchable laminate 38 was enabled. In this manner, the wiring board 10 was produced.

Immediately after the stretchable laminate 38 contracted, the radii of curvature of the crest portions and the valley portions were measured over five pitches of the plurality of crest portions and valley portions. As a result of measurement, the average value of the radius of curvature of the crest portion was 348 μm. In addition, the average value of the radius of curvature of the valley portion was 382 μm.

After 24 hours had elapsed at room temperature since contraction of the stretchable laminate 38, the radii of curvature of the crest portions and the valley portions were measured over five pitches of the plurality of crest portions and valley portions. As a result of measurement, the average value of the radius of curvature of the crest portion was 70 μm, and the average value of the radius of curvature of the valley portion was 523 μm. Therefore, the change ratios of the radius of curvature of the crest portion and the valley portion before and after 24 hours are −79.9% and +36.9%, respectively.

According to Examples 1 to 5, by providing the stress relaxation layer 30 having a modulus of elasticity lower than that of the substrate 20 between the interconnection wire 52 and the substrate 20, a change in the radius of curvature of the crest portion and valley portion of the interconnection wire 52 over time can be suppressed.

REFERENCE SIGNS LIST

10 Wiring board
20 Substrate
21 First surface
22 Second surface
23 Crest portion
24 Valley portion
25 Crest portion
26 Valley portion
30 Stress relaxation layer (First stress relaxation layer)
35 Second stress relaxation layer
38 Stretchable laminate
40 Support substrate
41 First surface
42 Second surface
51 Electronic component
52 Interconnection wire
57 Interconnection wire (Second interconnection wire)
53 Crest portion
54 Valley portion
55 Undulating portion
70 Reinforcing member
71 First portion
72 Second portion

The invention claimed is:
1. A wiring board comprising:
a substrate including a first surface and a second surface located on an opposite side to the first surface, the substrate having stretchability;
an interconnection wire located adjacent to the first surface of the substrate;

a stress relaxation layer located between the first surface of the substrate and the interconnection wire, the stress relaxation layer having a modulus of elasticity lower than a modulus of elasticity of the substrate; and a support substrate having a modulus of elasticity higher than the modulus of elasticity of the substrate and supporting the interconnection wire.

2. The wiring board according to claim 1, wherein the modulus of elasticity of the support substrate is higher than or equal to 100 times the modulus of elasticity of the substrate.

3. The wiring board according to claim 1, further comprising an adhesive layer located between the stress relaxation layer and the support substrate and having a modulus of elasticity higher than the modulus of elasticity of the stress relaxation layer.

4. The wiring board according to claim 1, further comprising:
a reinforcing member having a modulus of elasticity higher than the modulus of elasticity of the substrate.

5. The wiring board according to claim 4, wherein as viewed in a direction normal to the first surface of the substrate, the interconnection wire has an end portion that overlaps the reinforcing member.

6. The wiring board according to claim 4, further comprising:
an electronic component that overlaps the reinforcing member as viewed in a direction normal to the first surface of the substrate,
wherein the electronic component is electrically connected to the interconnection wire.

7. The wiring board according to claim 1, wherein the substrate and the stress relaxation layer contain a same type of elastomer as a principal component.

8. The wiring board according to claim 1, further comprising:
a second interconnection wire located adjacent to the second surface of the substrate; and
a second stress relaxation layer located between the second surface of the substrate and the second interconnection wire, the second stress relaxation layer having a modulus of elasticity lower than the modulus of elasticity of the substrate.

9. The wiring board according to claim 1, wherein the substrate contains silicone rubber as a primary component.

10. The wiring board according to claim 1, wherein the support substrate contains polyethylene naphthalate, polyimide, polycarbonate, acrylic resin, or polyethylene terephthalate.

11. The wiring board according to claim 1, wherein the interconnection wire has an undulating portion including a plurality of crest portions and valley portions aligned in a direction in which the interconnection wire extends.

12. The wiring board according to claim 11, wherein the stress relaxation layer has a thickness greater than or equal to 0.5 times the amplitude of the crest portions and the valley portions of the undulating portion of the interconnection wire.

13. The wiring board according to claim 11, wherein the stress relaxation layer has a thickness greater than or equal to 0.5 times a radius of curvature of the crest portion of the undulating portion of the interconnection wire.

14. The wiring board according to claim 11, wherein an amplitude of crest portions and valley portions that appear in a portion of the first surface of the substrate that overlaps the undulating portion of the interconnection wire is less than an amplitude of the crest portions and the valley portions of the undulating portion of the interconnection wire.

15. The wiring board according to claim 11, wherein an amplitude of crest portions and valley portions that appear in a portion of the first surface of the substrate that overlaps the undulating portion of the interconnection wire is less than or equal to 0.5 times an amplitude of the crest portions and the valley portions of the undulating portion of the interconnection wire.

16. The wiring board according to claim 11, wherein the pitch of the crest portion and valley portion that appear in a portion of the first surface of the substrate that overlaps the undulating portion of the interconnection wire is less than a pitch of the crest portion and the valley portion of the undulating portion of the interconnection wire.

17. A method for manufacturing a wiring board, comprising:
a step of preparing a laminate including a substrate including a first surface and a second surface located on an opposite side to the first surface and a stress relaxation layer located adjacent to the first surface of the substrate, wherein the substrate has stretchability and the stress relaxation layer has a modulus of elasticity lower than a modulus of elasticity of the substrate;
a step of preparing a support substrate on which an interconnection wire being provided, the support substrate having a modulus of elasticity higher than the modulus of elasticity of the substrate,
a stretch step of applying tension to the laminate in at least a first direction that is one of in-plane directions of the first surface of the substrate and stretching the laminate;
an interconnection wire forming step of providing the support substrate on the stress relaxation layer of the laminate being stretched in the stretch step; and
a contraction step of removing the tension from the laminate.

18. The method according to claim 17, wherein the modulus of elasticity of the support substrate is higher than or equal to 100 times the modulus of elasticity of the substrate.

19. The method according to claim 17, wherein the interconnection wire forming step provides the support substrate on the stress relaxation layer through an adhesive layer having a modulus of elasticity higher than the modulus of elasticity of the stress relaxation layer.

20. The method board according to claim 17, wherein the support substrate contains polyethylene naphthalate, polyimide, polycarbonate, acrylic resin, or polyethylene terephthalate.

* * * * *